(12) United States Patent
Nishizawa et al.

(10) Patent No.: US 12,556,137 B2
(45) Date of Patent: Feb. 17, 2026

(54) RESONATOR DEVICE

(71) Applicant: SEIKO EPSON CORPORATION, Tokyo (JP)

(72) Inventors: Ryuta Nishizawa, Nagano (JP); Junichi Takeuchi, Chino (JP)

(73) Assignee: SEIKO EPSON CORPORATION (JP)

( * ) Notice: Subject to any disclaimer, the term of this patent is extended or adjusted under 35 U.S.C. 154(b) by 856 days.

(21) Appl. No.: 17/876,657

(22) Filed: Jul. 29, 2022

(65) Prior Publication Data

US 2023/0032754 A1 Feb. 2, 2023

(30) Foreign Application Priority Data

Jul. 30, 2021 (JP) ................. 2021-125050

(51) Int. Cl.
H03B 5/04 (2006.01)
H01L 23/34 (2006.01)
H03B 5/36 (2006.01)
H03H 9/02 (2006.01)
H03H 9/08 (2006.01)
H03H 9/19 (2006.01)

(52) U.S. Cl.
CPC ............. H03B 5/04 (2013.01); H01L 23/345 (2013.01); H03B 5/36 (2013.01); H03H 9/02102 (2013.01); H03H 9/08 (2013.01); H03H 9/19 (2013.01)

(58) Field of Classification Search
CPC ........ H03B 5/04; H03B 5/36; H03H 9/02102; H03H 9/08; H03H 9/19; H03H 9/0552; H03H 9/0561; H03H 9/0519; H03H 9/0547; H03H 9/1021; H01L 23/345
See application file for complete search history.

(56) References Cited

U.S. PATENT DOCUMENTS

| 2017/0019109 | A1 | 1/2017 | Arai |
| 2017/0373637 | A1* | 12/2017 | Kondo ..................... H03B 1/02 |
| 2018/0302032 | A1 | 10/2018 | Oya et al. |
| 2019/0069390 | A1 | 2/2019 | Wang |
| 2020/0008294 | A1 | 1/2020 | Wang |
| 2021/0076484 | A1 | 3/2021 | Wang |
| 2021/0126583 | A1 | 4/2021 | Takeuchi |

FOREIGN PATENT DOCUMENTS

| CN | 106105025 A | 11/2016 |
| JP | 2012-074969 A | 4/2012 |
| JP | 2013-211752 A | 10/2013 |

(Continued)

Primary Examiner — Emily P Pham
(74) Attorney, Agent, or Firm — Harness, Dickey & Pierce, P.L.C.

(57) ABSTRACT

A resonator device includes: a resonator element; a heat generating unit; a first package including a first base at which the resonator element and the heat generating unit are disposed, and a first lid bonded to the first base so as to accommodate the resonator element between the first lid and the first base; and a low emissivity layer that is disposed at an inner surface of the first lid and that has an emissivity lower than an emissivity of the first lid. In addition, a constituent material of the first lid is silicon, and the emissivity of the low emissivity layer at room temperature is less than 0.5.

16 Claims, 18 Drawing Sheets

(56) References Cited

FOREIGN PATENT DOCUMENTS

| | | |
|---|---|---|
| JP | 2016-140009 A | 8/2016 |
| JP | 2017-028360 A | 2/2017 |
| JP | 2017-130861 A | 7/2017 |
| JP | 2019-041379 A | 3/2019 |
| JP | 2020-115688 A | 7/2020 |
| JP | 2021-072493 A | 5/2021 |
| WO | 2014-038268 A1 | 3/2014 |

* cited by examiner

RESONATOR DEVICE

The present application is based on, and claims priority from JP Application Serial Number 2021-125050, filed Jul. 30, 2021, the disclosure of which is hereby incorporated by reference herein in its entirety.

BACKGROUND

1. Technical Field

The present disclosure relates to a resonator device.

2. Related Art

A resonator device described in JP-A-2017-28360 includes: a package that includes a ceramic base having a concave portion opened to an upper surface and a metal lid bonded to the upper surface of the base so as to close the opening of the concave portion; and an oscillation circuit, a heat generating element, and a resonator element that are accommodated in an accommodation space in the package.

However, in the resonator device in JP-A-2017-28360, heat in the accommodation space is likely to be released to the outside of the package through the metal lid. Therefore, a temperature in the accommodation space tends to be unstable. Therefore, a temperature of the resonator element may be unstable and oscillation characteristics may deteriorate.

SUMMARY

A resonator device according to the present disclosure includes: a resonator element; a heat generating unit; a first package including a first base at which the resonator element and the heat generating unit are disposed, and a first lid bonded to the first base so as to accommodate the resonator element between the first lid and the first base; and a low emissivity layer that is disposed at an inner surface of the first lid and that has an emissivity lower than an emissivity of the first lid.

A resonator device according to the present disclosure includes: a resonator element; a heat generating unit; a first package including a first base at which the resonator element is disposed, and a first lid bonded to the first base so as to accommodate the resonator element between the first lid and the first base; a second package including a second base at which the first package is disposed, and a second lid bonded to the second base so as to accommodate the first package and the heat generating unit between the second lid and the second base; and a first low emissivity layer that is disposed at an inner surface of the second lid and that has an emissivity lower than an emissivity of the second lid.

DESCRIPTION OF EXEMPLARY EMBODIMENTS

Figure 2:
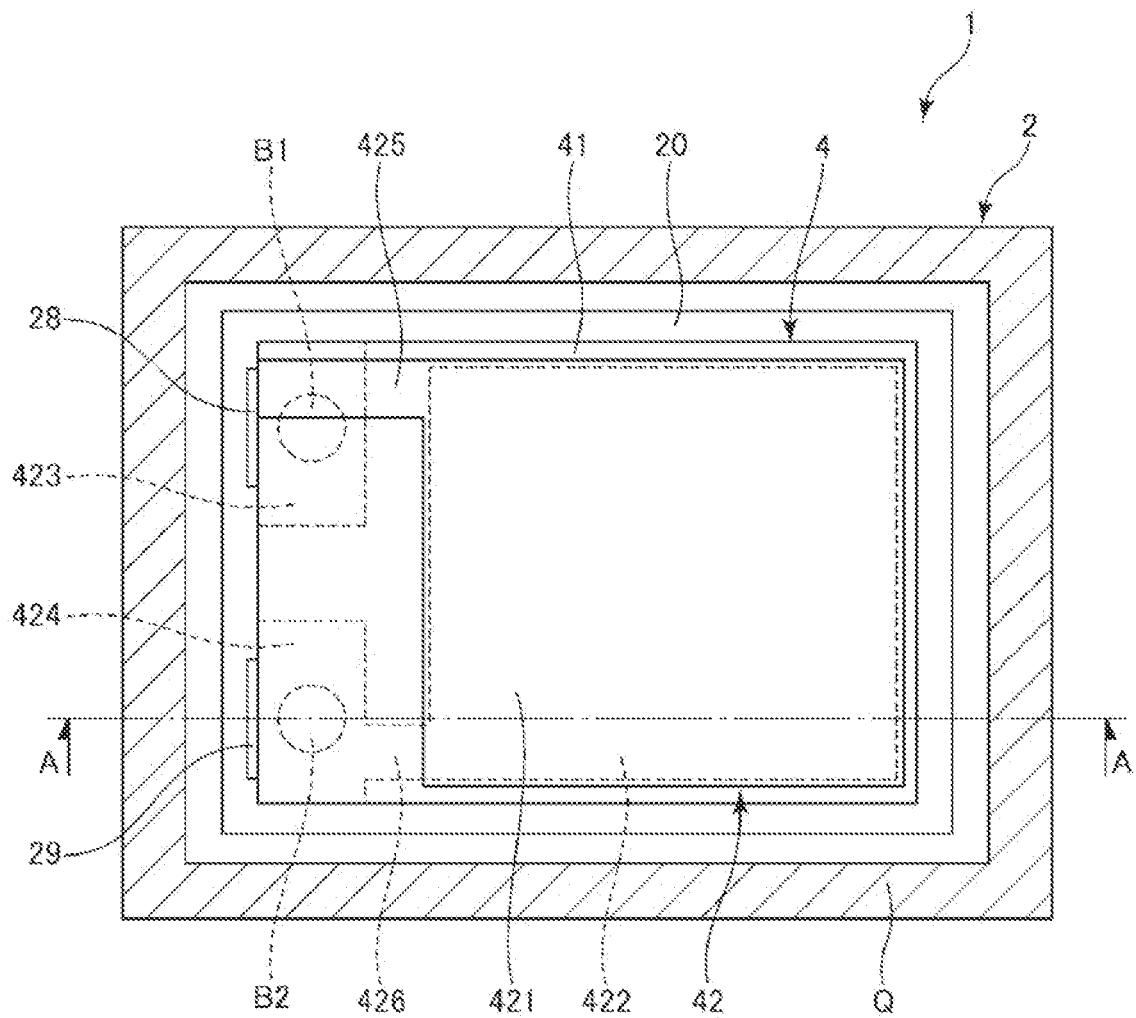
FIG. 2 is a plan view illustrating a resonator element.

Hereinafter, preferred embodiments of a resonator device will be described with reference to the accompanying drawings. For convenience of description, an upper side of each figure except FIG. 2 is also referred to as "upper", and a lower side of each figure except FIG. 2 is also referred to as "lower". In this case, in FIG. 2, a front side of a paper surface is "upper", and a back side of the paper surface is "lower".

First Embodiment

Figure 1:
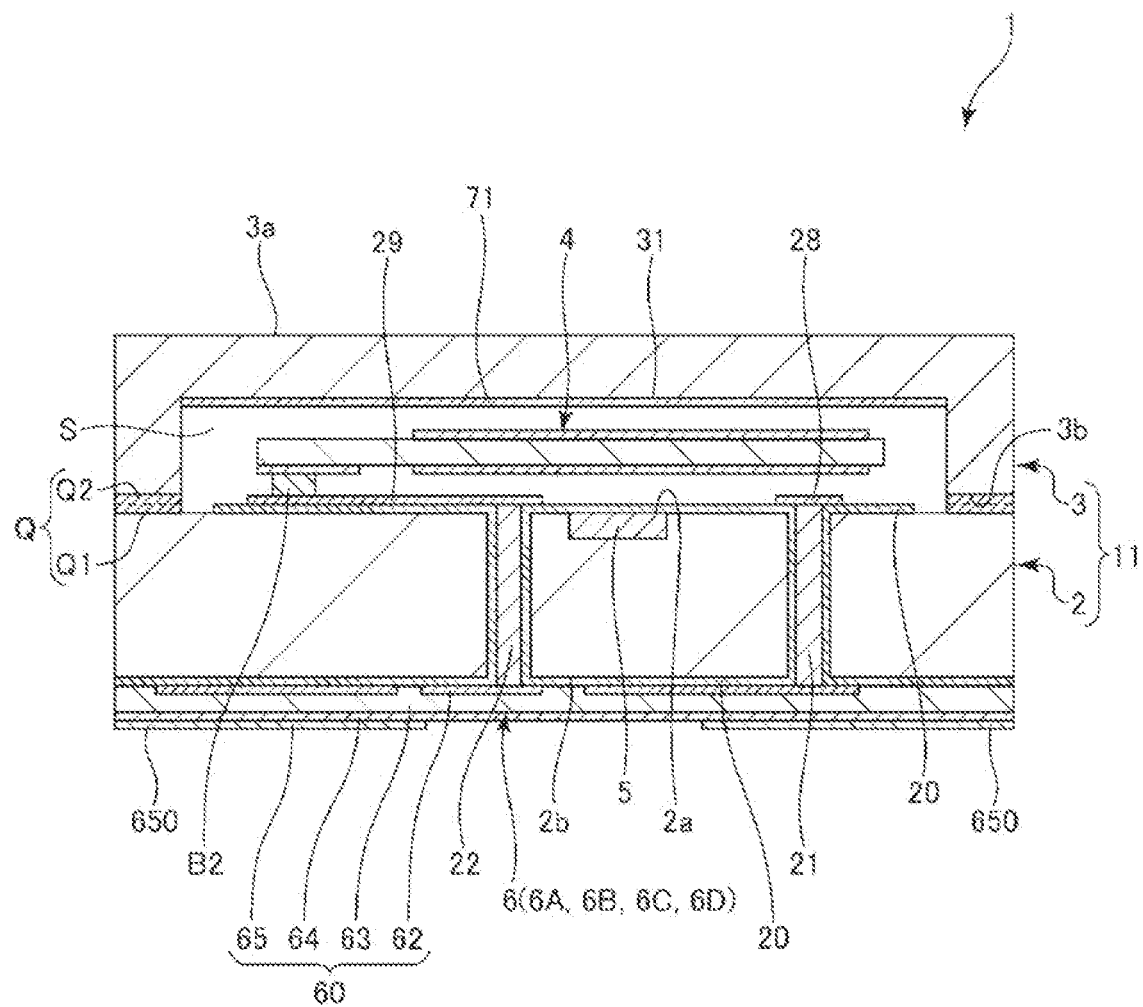
FIG. 1 is a cross-sectional view illustrating a resonator device according to a first embodiment, and is a cross-sectional view taken along a line A-A in FIG. 2.

FIG. 1 is a cross-sectional view illustrating a resonator device according to a first embodiment, and is a cross-sectional view taken along a line A-A in FIG. 2. FIG. 2 is a plan view illustrating a resonator element.

A resonator device 1 illustrated in FIG. 1 is an oscillator, particularly an oven controlled crystal oscillator (OCXO). The resonator device 1 includes a first package 11 provided with an airtight accommodation portion S inside, and a resonator element 4 accommodated in the accommodation portion S. In addition, the first package 11 includes a first base 2 at which the resonator element 4 is disposed, and a first lid 3 that covers the resonator element 4 and that is bonded to an upper surface 2a of the first base 2. In addition, a heater 5 serving as a heat generating unit is formed at an upper surface 2a side of the first base 2, and an integrated circuit 6 electrically coupled to the resonator element 4 and the heater 5 is formed at a lower surface 2b side of the first base 2.

The first base 2 is a silicon substrate. According to the present embodiment, in particular, the first base 2 uses a P-type silicon substrate. Therefore, when the resonator device 1 is used, the first base 2 is coupled to a ground which is a constant potential. However, the first base 2 is not particularly limited, and may be an N-type silicon substrate.

In addition, a semiconductor substrate other than silicon, for example, a semiconductor substrate such as Ge, GaP, GaAs, and InP may be used.

The first base 2 has a plate shape and has the upper surface 2a and the lower surface 2b that are in a front-to-back relationship. In addition, an insulating film 20 is formed at each of the upper surface 2a and the lower surface 2b. The insulating film 20 is, for example, a silicon oxide film formed by thermally oxidizing a surface of the first base 2. However, the insulating film 20 is not particularly limited, and may be, for example, a silicon nitride film. In addition, a method for forming the insulating film 20 is not limited to thermal oxidation, and may be, for example, chemical vapor deposition (CVD).

The heater 5 is formed at the upper surface 2a side of the first base 2. The heater 5 includes, for example, a resistance formed by diffusing impurities such as phosphorus and boron from the upper surface 2a side of the first base 2. The heater 5 has a function of heating the resonator element 4, and is electrically coupled to the integrated circuit 6. Accordingly, by disposing the heater 5 at the upper surface 2a side of the first base 2, the heater 5 can be disposed in the vicinity of the resonator element 4, and the resonator element 4 can be efficiently heated.

The integrated circuit 6 electrically coupled to the resonator element 4 and the heater 5 is formed at the lower surface 2b side of the first base 2. Accordingly, by forming the heater 5 and the integrated circuit 6 at the first base 2, the first base 2 can be effectively utilized and the resonator device 1 can be miniaturized.

The integrated circuit 6 includes, for example, a temperature sensor 6A, an oscillation circuit 6B, a temperature compensation circuit 6C, and a temperature control circuit 6D. The temperature sensor 6A is a sensor that detects a temperature of the resonator element 4. The oscillation circuit 6B is electrically coupled to the resonator element 4, amplifies an output signal of the resonator element 4, and feeds back the amplified signal to the resonator element 4 to oscillate the resonator element 4.

The temperature compensation circuit 6C performs temperature compensation such that variation in a frequency of the output signal is smaller than frequency-temperature characteristics of the resonator element 4 itself based on temperature information output from the temperature sensor 6A. For example, the temperature compensation circuit 6C may adjust an oscillation frequency of the oscillation circuit 6B by adjusting a capacitance of a variable capacitance circuit coupled to the oscillation circuit 6B, or adjust a frequency of an output signal of the oscillation circuit 6B by a PLL circuit or a direct digital synthesizer circuit.

The temperature control circuit 6D is a circuit that controls the amount of current flowing through the heater 5 and that keeps the resonator element 4 at a constant temperature based on an output signal of the temperature sensor 6A. For example, when a current temperature determined based on the output signal of the temperature sensor 6A is lower than a preset reference temperature, the temperature control circuit 6D executes control such that a desired current flows through the heater 5, and when the current temperature is higher than the reference temperature, the temperature control circuit 6D executes control such that no current flows through the heater 5. However, the present disclosure is not limited to this, and the temperature control circuit 6D may control the amount of current flowing through the heater 5 to increase or decrease according to a difference between the current temperature and the reference temperature.

A laminated body 60 formed by laminating a wiring layer 62, an insulating layer 63, a passivation film 64, and a terminal layer 65 is formed at the lower surface 2b of the first base 2. A plurality of active elements (not shown) formed at the lower surface 2b are electrically coupled to one another via a wiring provided in the wiring layer 62 to form the integrated circuit 6. In addition, the terminal layer 65 includes a plurality of terminals 650 electrically coupled to the integrated circuit 6. In the resonator device 1, the integrated circuit 6 is coupled to an external device via the terminal 650.

In an illustrated configuration, the laminated body 60 includes one wiring layer 62, but the present disclosure is not limited to this, and a plurality of the wiring layers 62 may be laminated via the insulating layers 63. That is, the wiring layers 62 and the insulating layers 63 may be alternately laminated a plurality of times. Accordingly, for example, a degree of freedom in routing the wiring in the integrated circuit 6 and disposing the plurality of terminals 650 can be improved.

The first base 2 is formed with a pair of through electrodes 21, 22 that penetrate the first base 2 in a thickness direction. In addition, a pair of wirings 28, 29 electrically coupled to the resonator element 4 are disposed at the upper surface 2a of the first base 2. The wirings 28, 29 are electrically coupled to the integrated circuit 6 via the through electrodes 21, 22. In addition, similarly, the first base 2 is formed with, for example, a through electrode (not shown) that penetrates the first base 2 in the thickness direction and that electrically couples the integrated circuit 6 and the heater 5.

Similar to the first base 2, the first lid 3 is a silicon substrate. Accordingly, linear expansion coefficients of the first base 2 and the first lid 3 are equal to each other, generation of thermal stress due to thermal expansion is prevented, and the resonator device 1 has excellent resonation characteristics. In addition, since the resonator device 1 can be formed by a semiconductor process, the resonator device 1 can be manufactured with high accuracy, and the resonator device 1 can be miniaturized. However, the first lid 3 is not particularly limited, and a semiconductor substrate other than silicon, for example, a semiconductor substrate such as Ge, GaP, GaAs, and InP may be used.

The first lid 3 has a box shape and has an upper surface 3a, a lower surface 3b, and a bottomed accommodating concave portion 31 that is open to the lower surface 3b and that accommodates the resonator element 4 inside. Such a first lid 3 is bonded to the upper surface 2a of the first base 2 via a metal layer Q at the lower surface 3b of the first lid 3. The metal layer Q is implemented by a bonded body of a first metal layer Q1 disposed at the upper surface 2a of the first base 2 and a second metal layer Q2 disposed at the lower surface 3b of the first lid 3. For example, the first base 2 and the first lid 3 are bonded to each other by irradiating surfaces of the first metal layer Q1 and the second metal layer Q2 with an ion beam or plasma, activating the surfaces of the first metal layer Q1 and the second metal layer Q2, and diffusing metal of the first metal layer Q1 and the second metal layer Q2. However, a method for bonding the first base 2 and the first lid 3 is not particularly limited.

The first lid 3 is electrically coupled to the first base 2 via the metal layer Q. As described above, since the first base 2 is coupled to the ground when the resonator device 1 is used, the first lid 3 is also coupled to the ground. Therefore, the entire first package 11 functions as an electromagnetic shield, and an influence of electromagnetic noise from the outside can be reduced. Therefore, the resonator device 1 has a high reliability.

A low emissivity layer 71 having an emissivity lower than that of the first lid 3 is disposed at an inner surface of the first lid 3, that is, a surface of the first lid 3 facing the accommodation portion S. In particular, according to the present embodiment, the low emissivity layer 71 is disposed at a bottom surface of the accommodating concave portion 31. Therefore, heat (mainly radiant heat from the heater 5) in the accommodation portion S is less likely to escape to the outside of the first package 11 through the first lid 3. Therefore, the inside of the accommodation portion S is uniformly heated, the temperature of the resonator element 4 is more stable, and the resonator device 1 can exert excellent oscillation characteristics. Further, since the heat in the accommodation portion S is less likely to escape to the outside of the first package 11, power consumption of the heater 5 is reduced, and the resonator device 1 can be driven in a power-saving manner.

The "emissivity" in the description of the present application is defined based on JIS Z8117, and the emissivity can be measured, for example, according to a spectral emissivity measurement method using a Fourier transform infrared spectroscopy (FTIR) according to JIS R1801. Since an emissivity of silicon, which is a constituent material of the first lid 3, at room temperature is about 0.5, the emissivity of the low emissivity layer 71 at room temperature may be less than 0.5. Accordingly, the heat in the accommodation portion S is less likely to escape, and the resonator device 1 can be driven in a power-saving manner and has the excellent oscillation characteristics.

A constituent material of the low emissivity layer 71 is not particularly limited, and may contain at least one of copper (0.03), titanium (0.08 to 0.19), tungsten (0.02), aluminum (0.02), aluminum oxide (0.11), gold (0.02), chromium (0.08), nickel (0.05), nickel oxide (0.31 to 0.46), platinum (0.05), silver (0.06), and cobalt (0.13). The numerical values in the parentheses each represent an emissivity. Among these materials, in particular, copper, titanium, tungsten, aluminum, aluminum oxide, and gold are easily used in the semiconductor process, and chromium, nickel, nickel oxide, platinum, silver, and cobalt are easily used for sputtering. Therefore, the resonator device 1 can be easily manufactured using these materials.

The accommodation portion S is airtight and is in a reduced pressure state, preferably a state closer to vacuum. Therefore, a viscous resistance is reduced and oscillation characteristics of the resonator element 4 are improved. However, an atmosphere of the accommodation portion S is not particularly limited, and for example, the accommodation portion S may be in an atmosphere in which an inert gas such as nitrogen or Ar is enclosed, or may be in an atmospheric pressure state or a pressured state instead of the reduced pressure state.

As illustrated in FIG. 2, the resonator element 4 includes a resonator substrate 41 and an electrode 42 disposed at a surface of the resonator substrate 41. The resonator substrate 41 has a thickness-shear resonation mode, and is formed of an AT cut quartz crystal substrate according to the present embodiment. Since the AT cut quartz crystal substrate has tertiary frequency-temperature characteristics, the resonator element 4 has excellent temperature characteristics. In addition, the electrode 42 includes an excitation electrode 421 disposed at an upper surface of the electrode 42 and an excitation electrode 422 disposed at a lower surface of the electrode 42 in a manner of facing the excitation electrode 421. In addition, the electrode 42 includes a pair of terminals 423, 424 that are disposed at a lower surface of the resonator substrate 41, a wiring 425 that electrically couples the terminal 423 and the excitation electrode 421, and a wiring 426 that electrically couples the terminal 424 and the excitation electrode 422.

A configuration of the resonator element 4 is not limited to the above configuration. For example, the resonator element 4 may have a mesa shape in which a resonation region sandwiched between the excitation electrodes 421, 422 protrudes from the periphery of the resonation region, or conversely, may have an inverted mesa shape in which the resonation region is recessed from the periphery thereof. In addition, bevel processing of grinding the periphery of the resonator substrate 41 and convex processing of causing an upper surface and the lower surface of the resonator substrate 41 to be convex curved surfaces may be performed.

The resonator element 4 is not limited to one that resonates in a thickness-shear resonation mode, and for example, a plurality of resonation arms may bend and resonate in an in-plane direction as a tuning fork type resonator element. That is, the resonator substrate 41 is not limited to one formed of the AT cut quartz crystal substrate, and may be formed of a quartz crystal substrate other than the AT cut quartz crystal substrate, for example, an X cut quartz crystal substrate, a Y cut quartz crystal substrate, a Z cut quartz crystal substrate, a BT cut quartz crystal substrate, an SC cut quartz crystal substrate, and an ST cut quartz crystal substrate.

A constituent material of the resonator substrate 41 is not limited to a quartz crystal, and for example, may be a piezoelectric single crystal body such as lithium niobate, lithium tantalate, lithium tetraborate, langasite crystal, potassium niobate, and gallium phosphate, or may be a piezoelectric single crystal body other than these components. Further, the resonator element 4 is not limited to a piezoelectric drive type resonator element, and may be an electrostatic drive type resonator element using electrostatic force.

Such a resonator element 4 is bonded to the upper surface 2a of the first base 2 through a pair of conductive bonding members B1, B2, and is electrically coupled to the wirings 28, 29. However, the bonding method is not particularly limited. For example, one coupling may be performed by a bonding member, and another coupling may be performed by a bonding wire.

The resonator device 1 is described above. As described above, such a resonator device 1 includes: the resonator element 4; the heater 5 serving as the heat generating unit; the first package 11 including the first base 2 at which the resonator element 4 and the heater 5 are disposed, and the first lid 3 bonded to the first base 2 so as to accommodate the resonator element 4 between the first lid 3 and the first base 2; and the low emissivity layer 71 that is disposed at the inner surface of the first lid 3 and that has the emissivity lower than the emissivity of the first lid 3. Accordingly, heat (mainly radiant heat from the heater 5) in the first package 11 is less likely to escape to the outside of the first package 11 through the first lid 3. Therefore, the inside of the first package 11 is uniformly heated, the temperature of the resonator element 4 is more stable, and the resonator device 1 can exert excellent oscillation characteristics. Further, since the heat in the first package 11 is less likely to escape to the outside of the first package 11, the power consumption of the heater 5 is reduced, and the resonator device 1 can be driven in a power-saving manner.

As described above, the constituent material of the first lid 3 is silicon, and the emissivity of the low emissivity layer 71 at room temperature is less than 0.5. Accordingly, the heat in the first package 11 is less likely to escape to the outside of the first package 11 through the first lid 3. Therefore, the resonator device 1 is energy-saving and can exert the excellent oscillation characteristics.

As described above, the constituent material of the low emissivity layer 71 contains at least one of copper, titanium, tungsten, aluminum, aluminum oxide, gold, chromium, nickel, nickel oxide, platinum, silver, and cobalt. Accordingly, the resonator device 1 can be easily manufactured.

Second Embodiment

Figure 3:
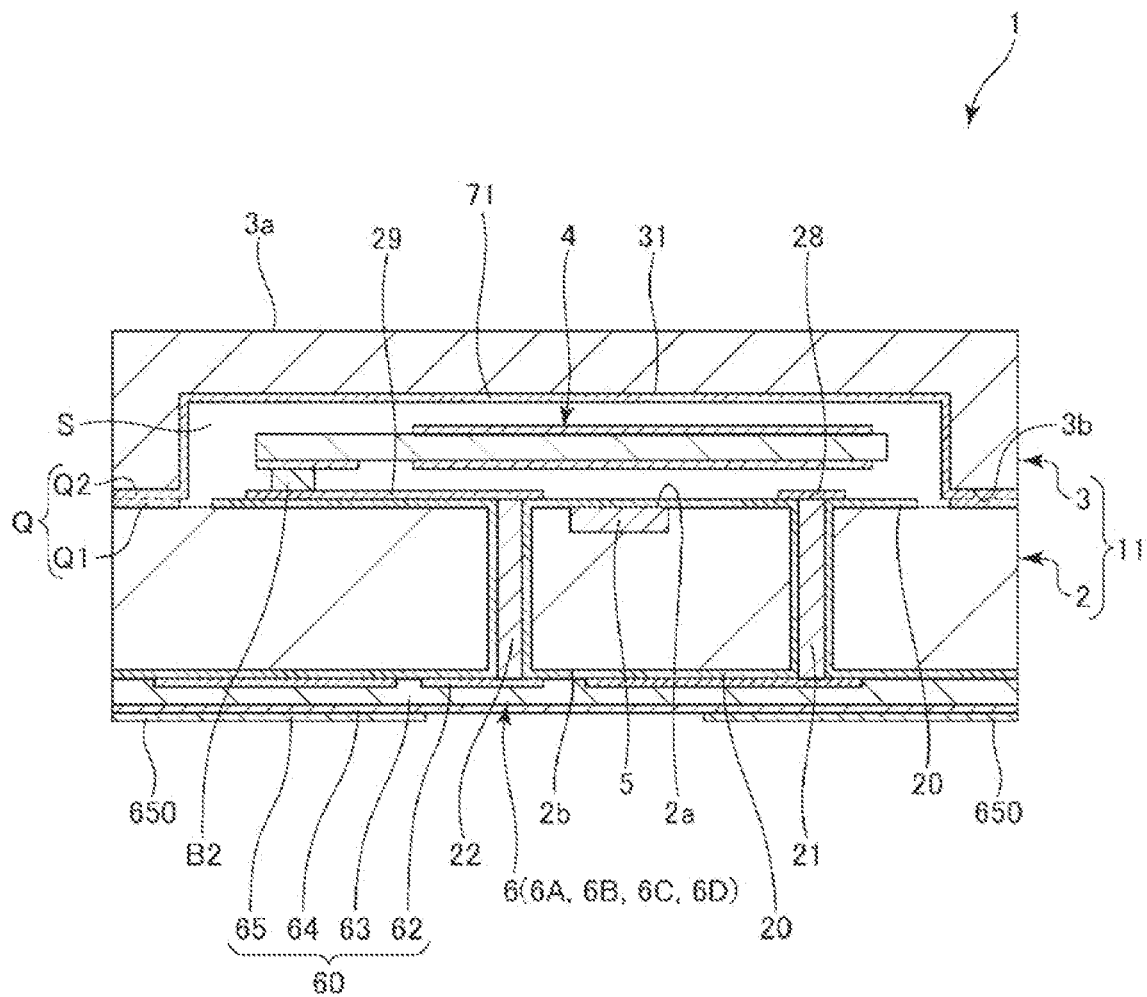
FIG. 3 is a cross-sectional view illustrating a resonator device according to a second embodiment.

FIG. 3 is a cross-sectional view illustrating a resonator device according to a second embodiment.

The present embodiment is the same as the above-described first embodiment, except that the disposition of the low emissivity layer 71 is mainly different. In the following description, the present embodiment will be described focusing on differences from the above-described embodiment, and the description of the same matters will be omitted. In addition, in the figure in the present embodiment, the same reference numerals are given to configurations similar to those according to the above-described embodiment.

As illustrated in FIG. 3, in the resonator device 1 according to the present embodiment, the low emissivity layer 71 is disposed at the bottom surface and a side surface of the accommodating concave portion 31, that is, the entire inner surface of the first lid 3. Accordingly, for example, heat in the accommodation portion S is less likely to escape to the outside of the first package 11 through the first lid 3 as compared with that according to the above-described first embodiment. Therefore, the resonator device 1 is more energy-saving and can exert more excellent oscillation characteristics.

Further, according to the present embodiment, the low emissivity layer 71 is made of the same material as the second metal layer Q2. Accordingly, the low emissivity layer 71 and the second metal layer Q2 can be collectively formed, and a manufacturing process of the resonator device 1 can be reduced. In particular, according to the present embodiment, since the low emissivity layer 71 and the second metal layer Q2 are integrally formed, patterning performed by masking or etching for separating the low emissivity layer 71 and the second metal layer Q2 is unnecessary. Therefore, the manufacturing of the resonator device 1 becomes easier.

As described above, the resonator device 1 according to the present embodiment includes the second metal layer Q2 serving as a bonding layer that bonds the first lid 3 and the first base 2, and the low emissivity layer 71 is made of the same material as the second metal layer Q2. Accordingly, the low emissivity layer 71 and the second metal layer Q2 can be collectively formed, and the manufacturing process of the resonator device 1 can be reduced.

According to the second embodiment, the same effect as that according to the above-described first embodiment can also be attained.

Third Embodiment

Figure 4:
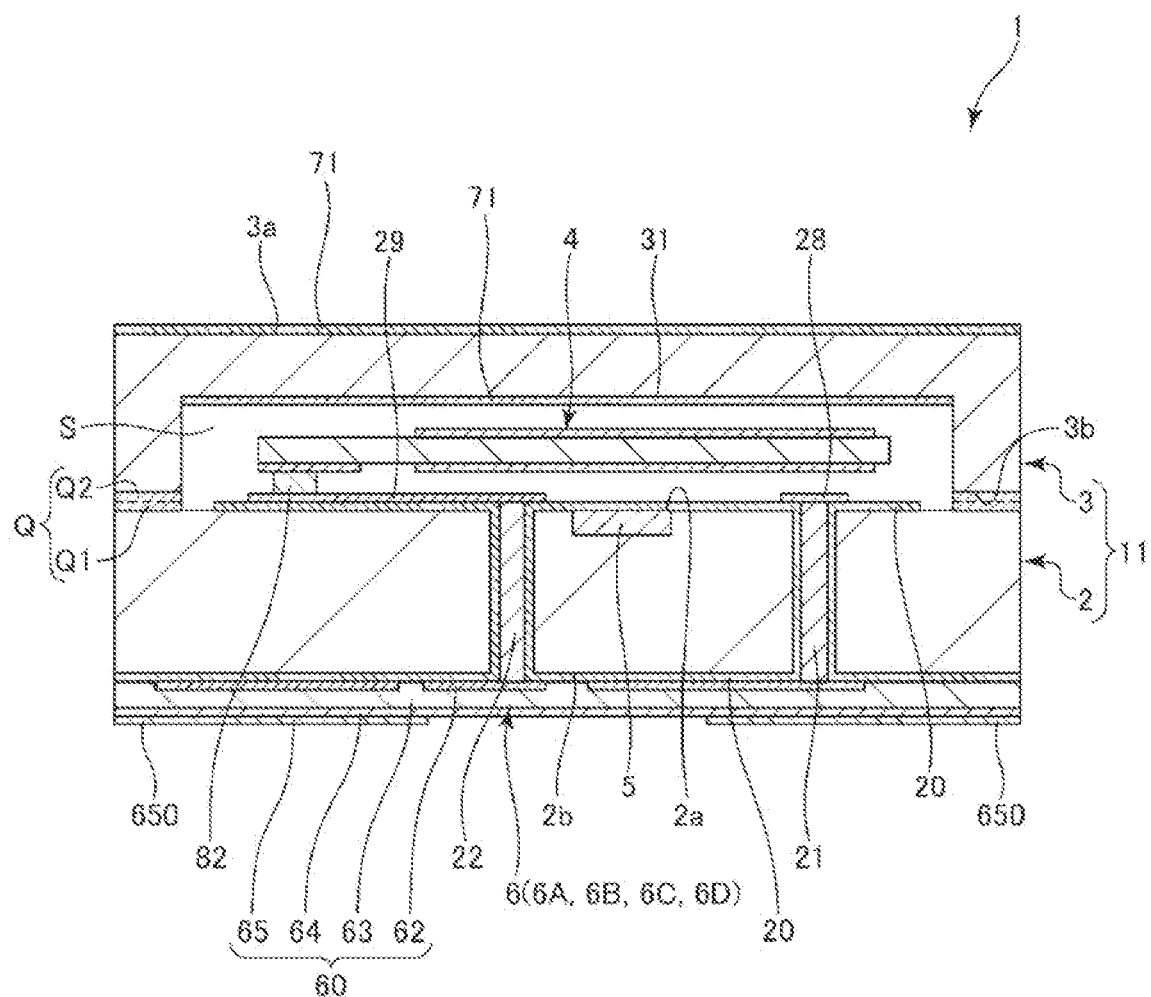
FIG. 4 is a cross-sectional view illustrating a resonator device according to a third embodiment.

FIG. 4 is a cross-sectional view illustrating a resonator device according to a third embodiment.

The present embodiment is the same as the above-described first embodiment, except that the disposition of the low emissivity layer 71 is mainly different. In the following description, the present embodiment will be described focusing on differences from the above-described embodiments, and the description of the same matters will be omitted. In addition, in the figure in the present embodiment, the same reference numerals are given to configurations similar to those according to the above-described embodiments.

As illustrated in FIG. 4, in the resonator device 1 according to the present embodiment, the low emissivity layer 71 is disposed at an outer surface of the first lid 3, that is, a surface of the first lid 3 facing the outside of the first package 11. In particular, according to the present embodiment, the low emissivity layer 71 is disposed at the upper surface 3a of the first lid 3. Accordingly, heat in the accommodation portion S is less likely to escape to the outside of the first package 11 through the first lid 3 as compared with that according to the above-described first embodiment. Therefore, the resonator device 1 is more energy-saving and can exert more excellent oscillation characteristics.

According to the present embodiment, the low emissivity layer 71 is disposed only at the upper surface 3a of the first lid 3. However, the present disclosure is not limited to this, and for example, the low emissivity layer 71 may also be disposed at a side surface of the first lid 3. That is, the low emissivity layer 71 may be disposed at the entire outer surface of the first lid 3. Accordingly, the above-described effects are more remarkable.

As described above, in the resonator device 1 according to the present embodiment, the low emissivity layer 71 is also disposed at the outer surface of the first lid 3. Accordingly, further, the heat in the accommodation portion S is less likely to escape to the outside of the first package 11 through the first lid 3. Therefore, the resonator device 1 is more energy-saving and can exert the more excellent oscillation characteristics.

According to the third embodiment, the same effect as that according to the above-described first embodiment can also be attained.

Fourth Embodiment

Figure 5:
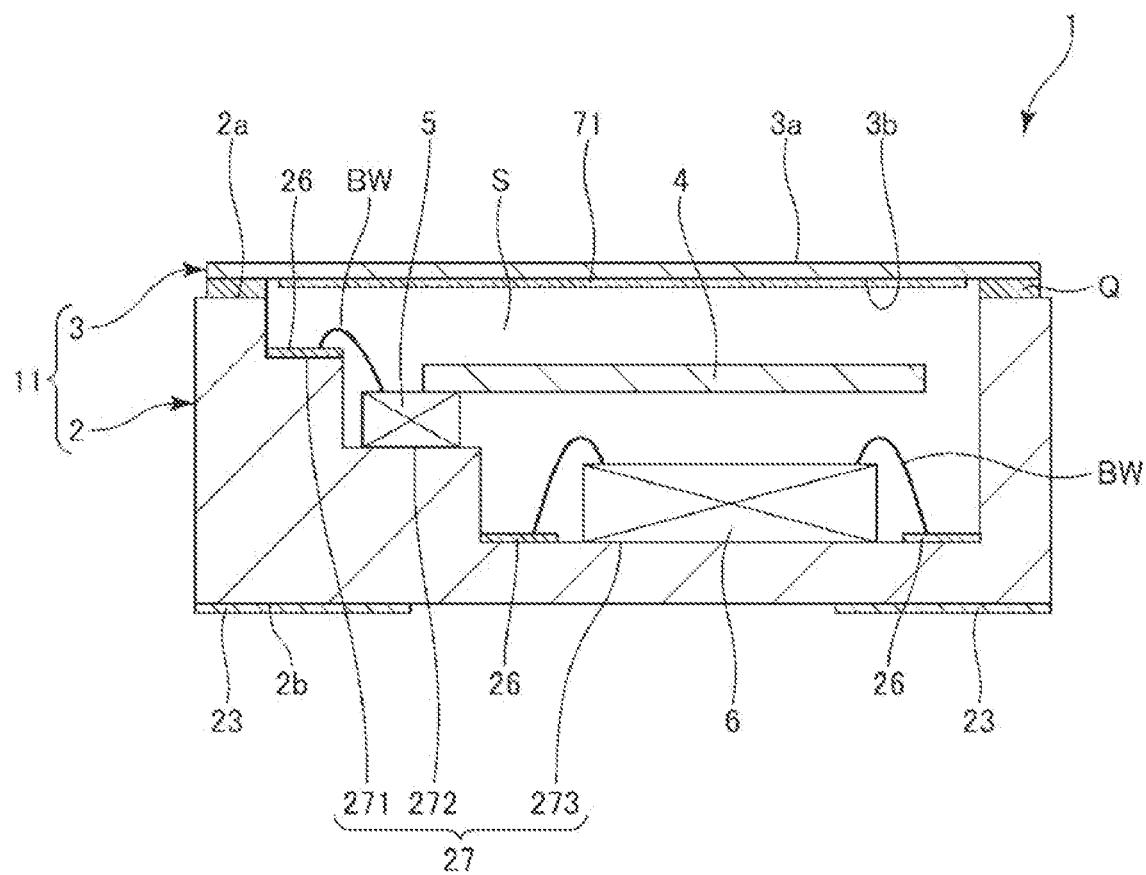
FIG. 5 is a cross-sectional view illustrating a resonator device according to a fourth embodiment.

FIG. 5 is a cross-sectional view illustrating a resonator device according to a fourth embodiment.

The present embodiment is the same as the above-described first embodiment, except that the configuration of the first package 11 is mainly different. In the following description, the present embodiment will be described focusing on differences from the above-described embodiments, and the description of the same matters will be omitted. In addition, in the figure in the present embodiment, the same reference numerals are given to configurations similar to those according to the above-described embodiments.

As illustrated in FIG. 5, in the resonator device 1 according to the present embodiment, the first base 2 is formed of a ceramic substrate, and the first lid 3 is formed of a metal substrate made of Kovar. Accordingly, the first package 11 has high mechanical strength. In addition, the integrated circuit 6 and the heater 5 are formed in a chip shape separate from the first base 2 and are fixed to the first base 2.

The first base 2 has a concave portion 27 that is open to the upper surface 2a, and the first lid 3 is bonded to the upper surface 2a of the first base 2 via the metal layer Q so as to close the opening of the concave portion 27. In addition, the concave portion 27 includes a first concave portion 271 that is open to the upper surface 2a, a second concave portion 272 that is open to a bottom surface of the first concave portion 271 and that is smaller than the first concave portion 271, and a third concave portion 273 that is open to a bottom surface of the second concave portion 272 and that is smaller than the second concave portion 272. The integrated circuit 6 is disposed at a bottom surface of the third concave portion 273, the heater 5 is disposed at the bottom surface of the second concave portion 272, and the resonator element 4 is disposed at an upper surface of the heater 5. The resonator element 4, the integrated circuit 6, and the heater 5 are electrically coupled to one another via an internal wiring 26 formed at the first base 2 and a bonding wire BW. In addition, a plurality of terminals 23 electrically coupled to the integrated circuit 6 are disposed at the lower surface 2b of the first base 2, and the integrated circuit 6 is coupled to an external device via the terminal 23.

The low emissivity layer 71 is disposed at the inner surface, that is, the lower surface 3b of the first lid 3. Since an emissivity of Kovar, which is a constituent material of the first lid 3, at room temperature is about 0.05, an emissivity of the low emissivity layer 71 may be less than 0.05. Accordingly, heat in the accommodation portion S is less likely to escape to the outside of the first package 11, and the resonator device 1 is energy-saving and has excellent oscillation characteristics.

A constituent material of the low emissivity layer 71 is not particularly limited, and may contain at least one of copper (0.03), tungsten (0.02), aluminum (0.02), and gold (0.02). The numerical values in the parentheses each represent an emissivity. Since these materials are materials that are easily used in a semiconductor process, the resonator device 1 is easily manufactured using these materials.

As described above, in the resonator device 1 described above, the constituent material of the first lid 3 is Kovar, and the emissivity of the low emissivity layer 71 at room temperature is less than 0.05. Accordingly, heat in the first package 11 is less likely to escape to the outside of the first package 11 through the first lid 3. Therefore, the resonator device 1 is energy-saving and can exert excellent oscillation characteristics.

As described above, the constituent material of the low emissivity layer 71 contains at least one of copper, tungsten, aluminum, and gold. Accordingly, the resonator device 1 can be easily manufactured.

According to the fourth embodiment, the same effect as that according to the above-described first embodiment can also be attained. The low emissivity layer 71 can be disposed not only at the inner surface, that is, the lower surface 3b of the first lid 3, but also at the outer surface, that is, the upper surface 3a and the side surface of the first lid 3.

Fifth Embodiment

Figure 6:
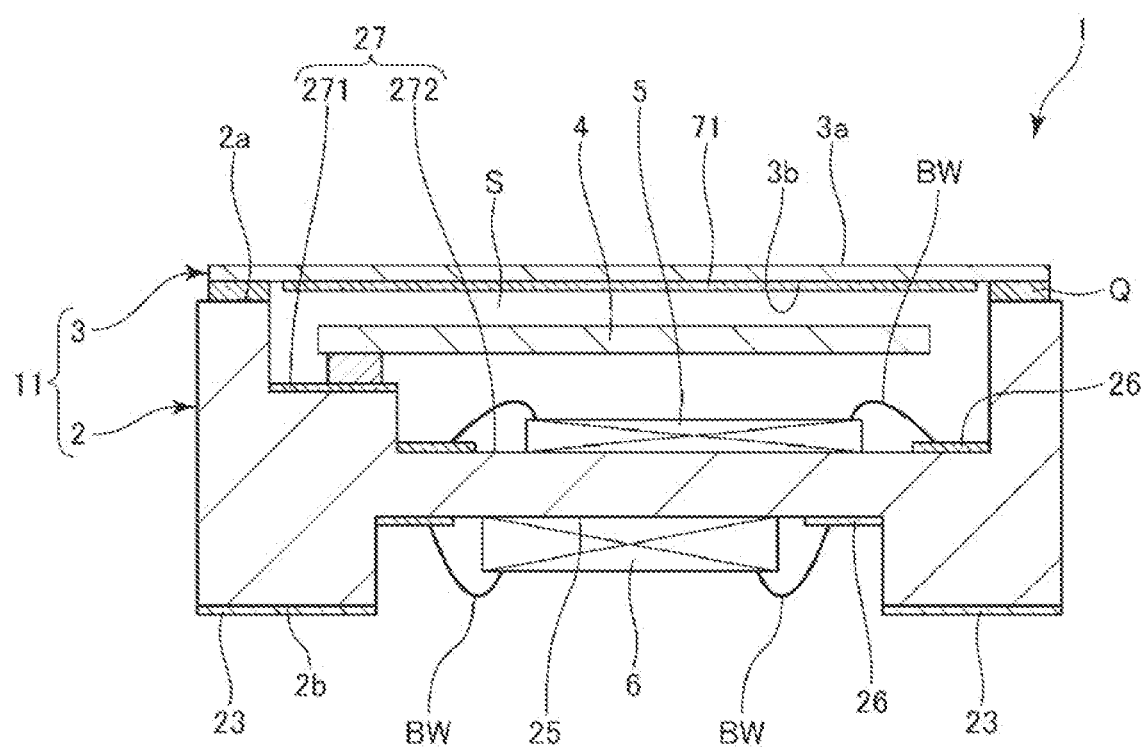
FIG. 6 is a cross-sectional view illustrating a resonator device according to a fifth embodiment.

FIG. 6 is a cross-sectional view illustrating a resonator device according to a fifth embodiment.

The present embodiment is the same as the above-described fourth embodiment, except that the configuration of the first package 11 is mainly different. In the following description, the present embodiment will be described focusing on differences from the above-described embodiments, and the description of the same matters will be omitted. In addition, in the figure in the present embodiment, the same reference numerals are given to configurations similar to those according to the above-described embodiments.

As illustrated in FIG. 6, in the resonator device 1 according to the present embodiment, the first base 2 has the concave portion 27 that is open to the upper surface 2a and a concave portion 25 that is open to the lower surface 2b, and the first lid 3 is bonded to the upper surface 2a of the first base 2 via the metal layer Q so as to close the opening of the concave portion 27.

The concave portion 27 includes the first concave portion 271 that is open to the upper surface 2a, and the second concave portion 272 that is open to the bottom surface of the first concave portion 271 and that is smaller than the first concave portion 271. The heater 5 is disposed at the bottom surface of the second concave portion 272, the resonator element 4 is disposed at the bottom surface of the first concave portion 271, and the integrated circuit 6 is disposed at a bottom surface of the concave portion 25. The resonator element 4, the integrated circuit 6, and the heater 5 are electrically coupled to one another via the internal wirings 26 formed at the first base 2 and the bonding wires BW. In addition, the plurality of terminals 23 electrically coupled to the integrated circuit 6 are disposed at the lower surface 2b of the first base 2, and the integrated circuit 6 is coupled to the external device via the terminal 23.

According to the fifth embodiment, the same effect as that according to the above-described first embodiment can also be attained.

Sixth Embodiment

Figure 7:
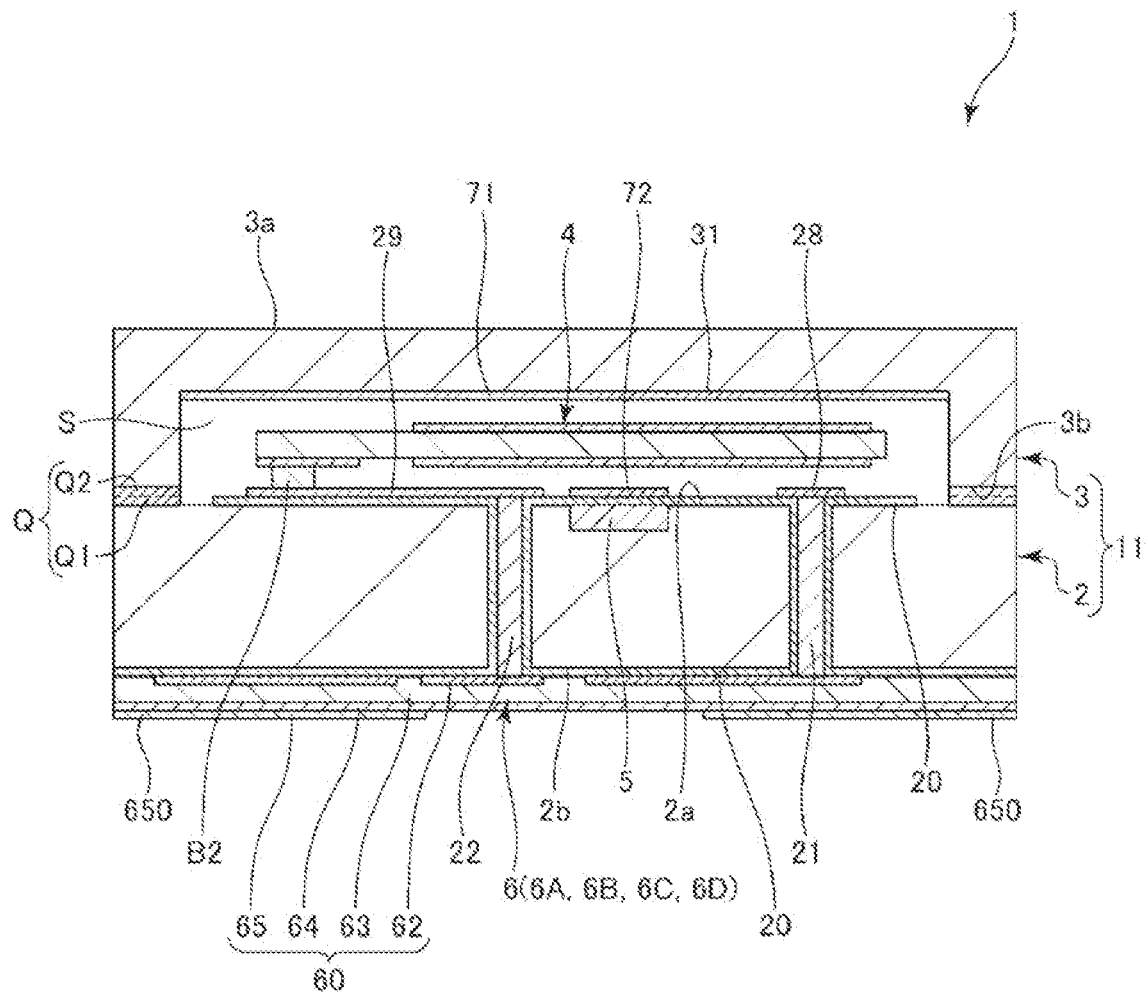
FIG. 7 is a cross-sectional view illustrating a resonator device according to a sixth embodiment.

FIG. 7 is a cross-sectional view illustrating a resonator device according to a sixth embodiment.

The present embodiment is the same as the above-described first embodiment, except that a high emissivity layer 72 is further provided. In the following description, the present embodiment will be described focusing on differences from the above-described embodiments, and the description of the same matters will be omitted. In addition, in the figure in the present embodiment, the same reference numerals are given to configurations similar to those according to the above-described embodiments.

As illustrated in FIG. 7, the resonator device 1 according to the present embodiment further includes the high emissivity layer 72 that is disposed at the upper surface 2a side of the first base 2, that is disposed at a portion overlapping with the heater 5, and whose upper surface faces the accommodation portion S. The high emissivity layer 72 has an emissivity higher than that of silicon, which is a constituent material of the first base 2. Accordingly, the high emissivity layer 72 absorbs heat of the heater 5 and efficiently releases the absorbed heat into the accommodation portion S. Therefore, the resonator element 4 can be quickly heated to a desired temperature, a time from the start to the resonator element 4 reaching the desired temperature is short, and the resonator device 1 has good starting characteristics.

In particular, according to the present embodiment, the high emissivity layer 72 is disposed only directly above the heater 5, and for example, the high emissivity layer 72 does not spread around the heater 5 in a plan view. Therefore, the dispersion of heat in the high emissivity layer 72 is prevented, and the above-described effect is more remarkable. However, the disposition of the high emissivity layer 72 is not particularly limited.

Since the emissivity of silicon at room temperature is about 0.5, the emissivity of the high emissivity layer 72 at room temperature may be 0.5 or more. Accordingly, the heat of the heater 5 can be more efficiently released into the accommodation portion S, and the resonator device 1 has better starting characteristics.

A constituent material of the high emissivity layer 72 may contain at least one of copper oxide (0.87), titanium oxide (0.51 to 0.61), silicon oxide (0.65 to 0.9), silicon nitride (0.75 to 0.9), a glass material (0.91 to 0.94), aluminum nitride (0.93), and platinum black (0.93). The numerical values in the parentheses each represent an emissivity.

Among these materials, in particular, copper oxide, titanium oxide, silicon oxide, silicon nitride, and aluminum nitride are materials that are easily used in a semiconductor process. In addition, platinum black is a material that is easily used for spattering. Therefore, the resonator device 1 can be easily manufactured using these materials.

As the constituent material of the high emissivity layer 72, a metal-based material such as copper oxide, titanium oxide, aluminum nitride, and platinum black may be used rather than a silicon-based material such as silicon oxide and silicon nitride. The metal-based material has a thermal conductivity higher than that of the silicon-based material, and can attain a higher heat releasing effect.

According to the sixth embodiment, the same effect as that according to the above-described first embodiment can also be attained.

Seventh Embodiment

Figure 8:
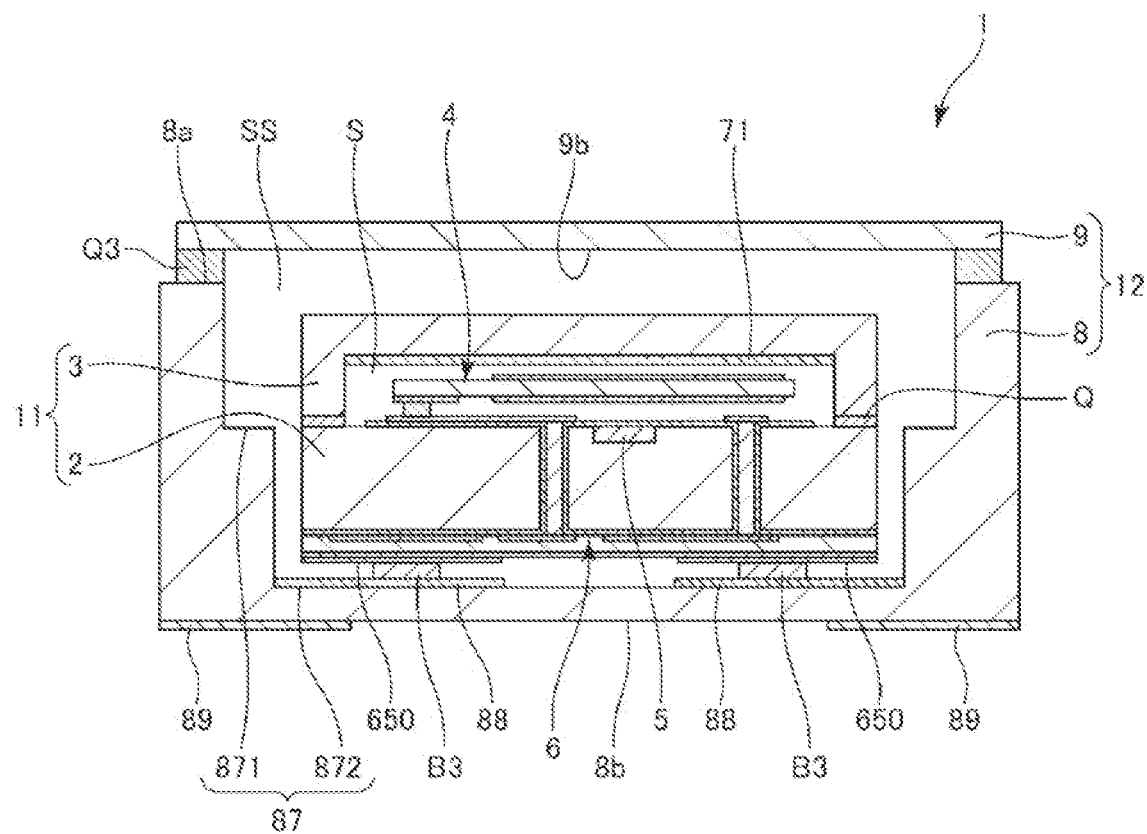
FIG. 8 is a cross-sectional view illustrating a resonator device according to a seventh embodiment.

FIG. 8 is a cross-sectional view illustrating a resonator device according to a seventh embodiment.

The present embodiment is the same as the above-described first embodiment, except that a second package 12 accommodating the first package 11 is provided. In the following description, the present embodiment will be described focusing on differences from the above-described embodiments, and the description of the same matters will be omitted. In addition, in the figure in the present embodiment, the same reference numerals are given to configurations similar to those according to the above-described embodiments.

As illustrated in FIG. 8, the second package 12 includes a second base 8 to which the first package 11 is bonded, and a second lid 9 that covers the first package 11 and that is bonded to an upper surface 8a of the second base 8. The second base 8 is formed of a ceramic substrate, and the second lid 9 is formed of a metal substrate made of Kovar. Accordingly, the second package 12 has high mechanical strength, and can more firmly protect the first package 11 accommodated in the second package 12. Further, since the resonator device 1 has a double package structure, heat of the heater 5 is less likely to escape to the outside of the resonator device 1, and the resonator device 1 is energy-saving and has excellent oscillation characteristics. An accommodation portion SS in the second package 12 may be in a reduced pressure state, preferably in a state close to vacuum. Accordingly, a heat insulating property of the second package 12 is improved, and the above-described effect is more remarkable.

The second base 8 has a concave portion 87 that is open to the upper surface 8a, and the second lid 9 is bonded to the upper surface 8a of the second base 8 via a metal layer Q3 so as to close the opening of the concave portion 87. In addition, the concave portion 87 includes a first concave portion 871 that is open to the upper surface 8a and a second concave portion 872 that is open to a bottom surface of the first concave portion 871 and that is smaller than the first concave portion 871. In addition, a plurality of terminals 88 are disposed at a bottom surface of the second concave portion 872, and a plurality of terminals 89 electrically coupled to the terminals 88 are disposed at a lower surface 8b of the second base 8.

The first package 11 is disposed at the bottom surface of the second concave portion 872. The first package 11 is fixed to the bottom surface of the second concave portion 872 via a conductive bonding member B3 in a posture in which the first base 2 faces the bottom surface of the second concave portion 872. In addition, the terminals 650 and the terminals 88 are electrically coupled to each other via the bonding member B3.

As described above, the resonator device 1 according to the present embodiment includes the second package 12 including the second base 8 at which the first package 11 is disposed and the second lid 9 bonded to the second base 8 so as to accommodate the first package 11 between the second lid 9 and the second base 8. Accordingly, the second package 12 has high mechanical strength, and can more firmly protect the first package 11 accommodated in the second package 12. Furthermore, since the resonator device 1 has the double package structure, the heat of the heater 5 is less likely to escape to the outside of the resonator device 1, and the resonator device 1 is energy-saving and has the excellent oscillation characteristics.

According to the seventh embodiment, the same effect as that according to the above-described first embodiment can also be attained.

Eighth Embodiment

Figure 9:
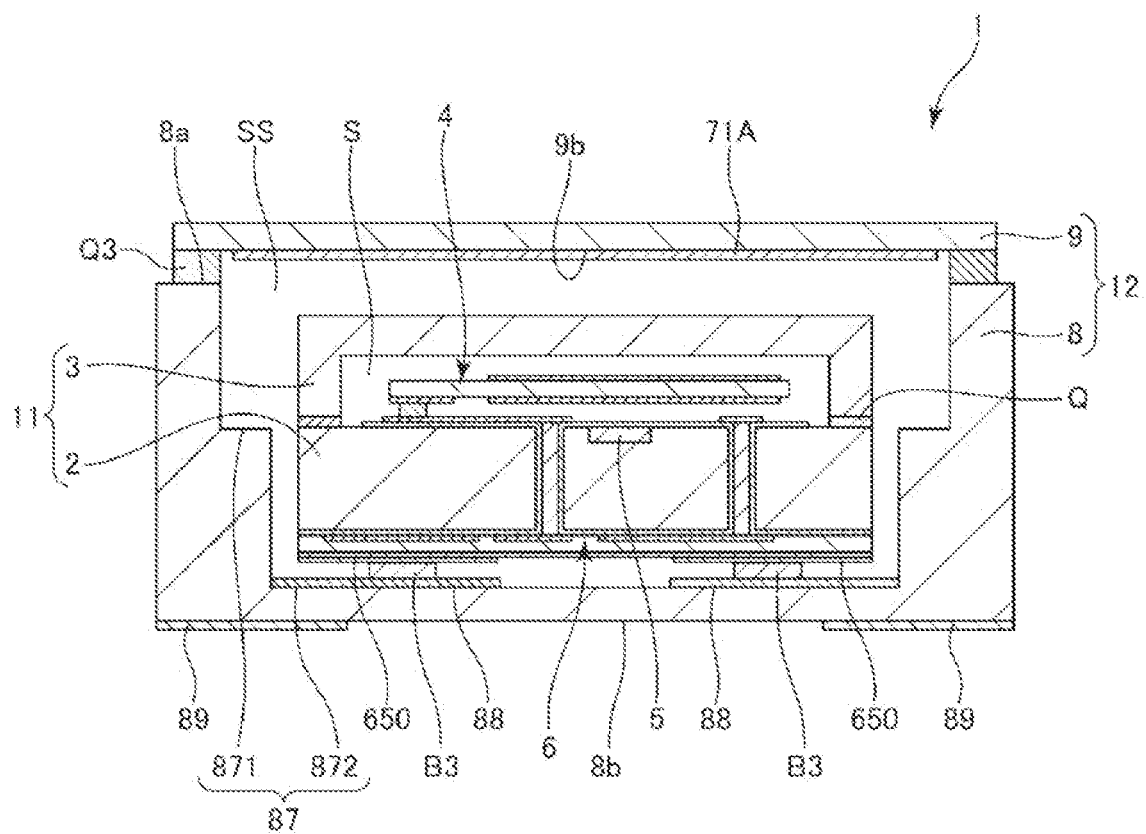
FIG. 9 is a cross-sectional view illustrating a resonator device according to an eighth embodiment.
Figure 10:
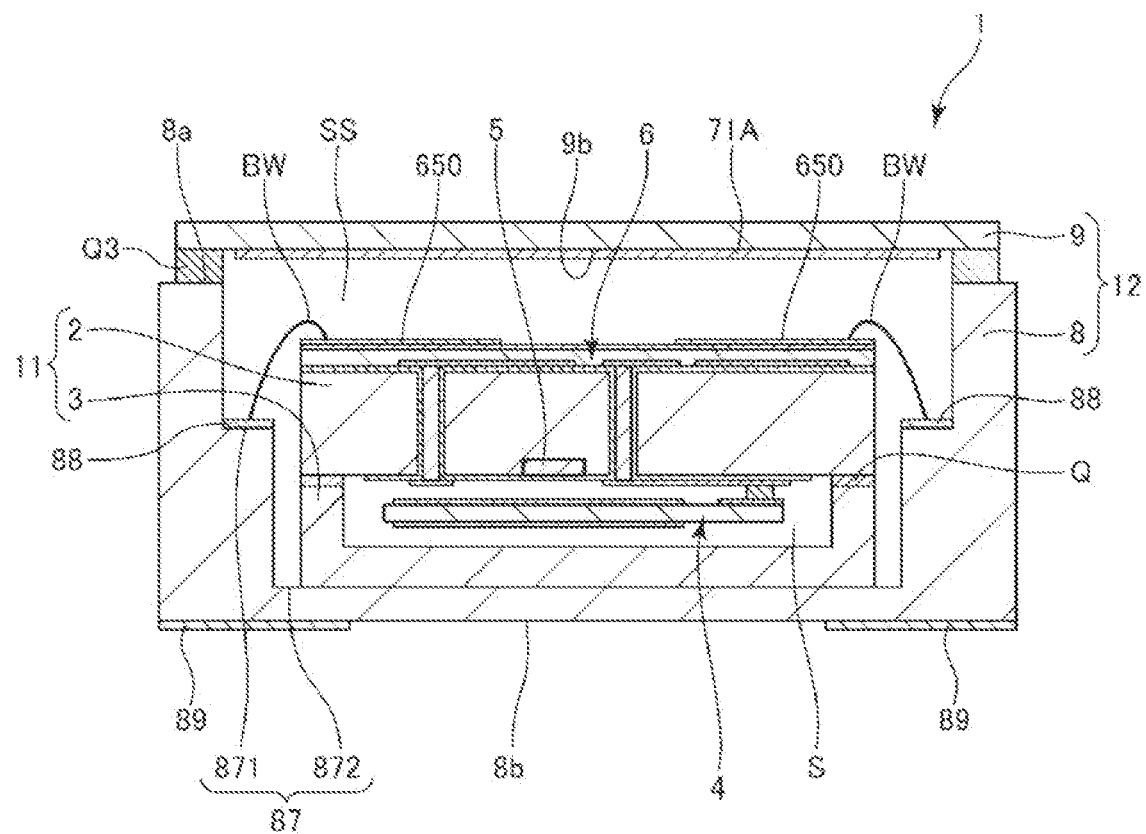
FIG. 10 is a cross-sectional view illustrating a modification of the resonator device in FIG. 9.
Figure 11:
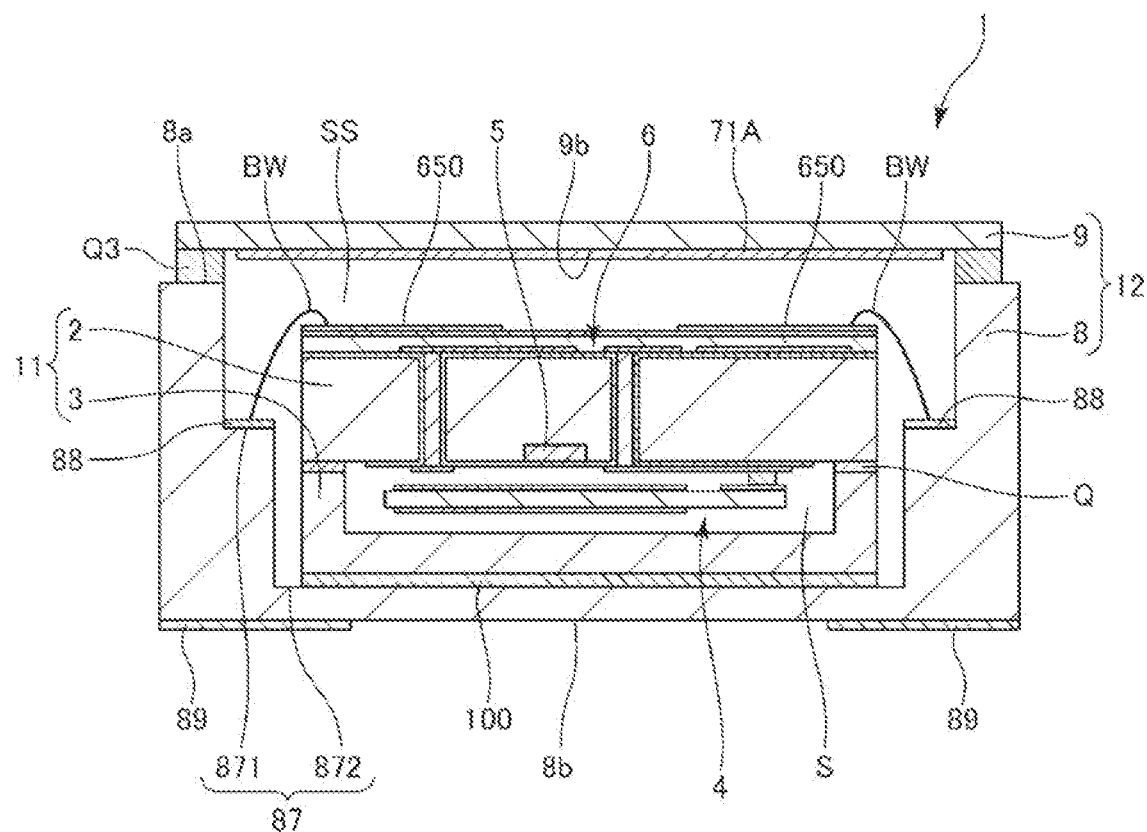
FIG. 11 is a cross-sectional view illustrating a modification of the resonator device in FIG. 9.

FIG. 9 is a cross-sectional view illustrating a resonator device according to an eighth embodiment. FIGS. 10 and 11 are cross-sectional views illustrating a modification of the resonator device in FIG. 9.

The present embodiment is the same as the above-described seventh embodiment, except that the disposition of the low emissivity layer is different. In the following description, the present embodiment will be described focusing on differences from the above-described embodiments, and the description of the same matters will be omitted. In addition, in the figure in the present embodiment, the same reference numerals are given to configurations similar to those according to the above-described embodiments.

As illustrated in FIG. 9, in the resonator device 1 according to the present embodiment, the low emissivity layer 71 is omitted from the inner surface of the first lid 3, and instead, a first low emissivity layer 71A having an emissivity lower than that of the second lid 9 is disposed at an inner surface, that is, a lower surface 9b of the second lid 9. Therefore, heat in the heater 5 is less likely to escape to the outside of the second package 12. Therefore, the inside of the accommodation portion S is uniformly heated, a temperature of the resonator element 4 is more stable, and the resonator device 1 can exert excellent oscillation characteristics. Further, since heat in the accommodation portion S is less likely to escape, power consumption of the heater 5 is reduced, and the resonator device 1 can be driven in a power-saving manner.

Since an emissivity of Kovar, which is a constituent material of the second lid 9, at room temperature is about 0.05, an emissivity of the first low emissivity layer 71A may be less than 0.05. Accordingly, the heat in the heater 5 is less likely to escape to the outside of the second package 12, and the resonator device 1 is energy-saving and has the excellent oscillation characteristics.

A constituent material of the first low emissivity layer 71A is not particularly limited, and may contain at least one of copper, tungsten, aluminum, and gold. Since these materials are materials that are easily used in a semiconductor process, the resonator device 1 is easily manufactured using these materials.

The resonator device 1 according to the present embodiment is described above. Such a resonator device 1 includes: the resonator element 4; the heater 5 serving as the heat generating unit; the first package 11 including the first base 2 at which the resonator element 4 is disposed, and the first lid 3 bonded to the first base 2 so as to accommodate the resonator element 4 between the first lid 3 and the first base 2; the second package 12 including the second base 8 at which the first package 11 is disposed and the second lid 9 bonded to the second base 8 so as to accommodate the first package 11 and the heater 5 between the second lid 9 and the second base 8; and the first low emissivity layer 71A that is disposed at the inner surface of the second lid 9 and that has the emissivity lower than the emissivity of the second lid 9. Accordingly, the heat in the heater 5 is less likely to escape to the outside of the second package 12 through the second lid 9. Therefore, the inside of the first package 11 is uniformly heated, the temperature of the resonator element 4 is more stable, and the resonator device 1 can exert the excellent oscillation characteristics. Further, the power consumption of the heater 5 is reduced, and the resonator device 1 can be driven in a power-saving manner.

As described above, the constituent material of the second lid 9 is Kovar, and the emissivity of the first low emissivity layer 71A at room temperature is less than 0.05. Accordingly, the heat in the heater 5 is less likely to escape to the outside of the second package 12 through the second lid 9. Therefore, the resonator device 1 is energy-saving and can exert the excellent oscillation characteristics.

As described above, the constituent material of the first low emissivity layer 71A contains at least one of copper, tungsten, aluminum, and gold. Accordingly, the resonator device 1 can be easily manufactured.

As described above, the heater 5 is disposed at the first base 2. Accordingly, the heater 5 can be disposed in the vicinity of the resonator element 4, and the resonator element 4 can be efficiently heated.

According to the eighth embodiment as described above, the same effect as that according to the above-described first embodiment can also be attained.

However, the resonator device 1 according to the present embodiment is not limited to this. For example, as illustrated in FIG. 10, an orientation of the first package 11 may be reversed and the first lid 3 may be disposed in a posture of facing a bottom surface of the concave portion 87. At this time, for example, the terminals 650 and the terminals 88 can be electrically coupled to each other using the bonding wires BW. In addition, as illustrated in FIG. 11, in the configuration in FIG. 10, a heat insulating layer 100 may be further interposed between the first lid 3 and the bottom surface of the concave portion 87. Accordingly, it is possible to prevent the escape of the heat to the outside of the second package 12 due to thermal conduction. In addition, although not shown, for example, the high emissivity layer 72 according to the above-described sixth embodiment may be added to the first package 11 in the configuration in FIGS. 8 to 10.

Ninth Embodiment

Figure 12:
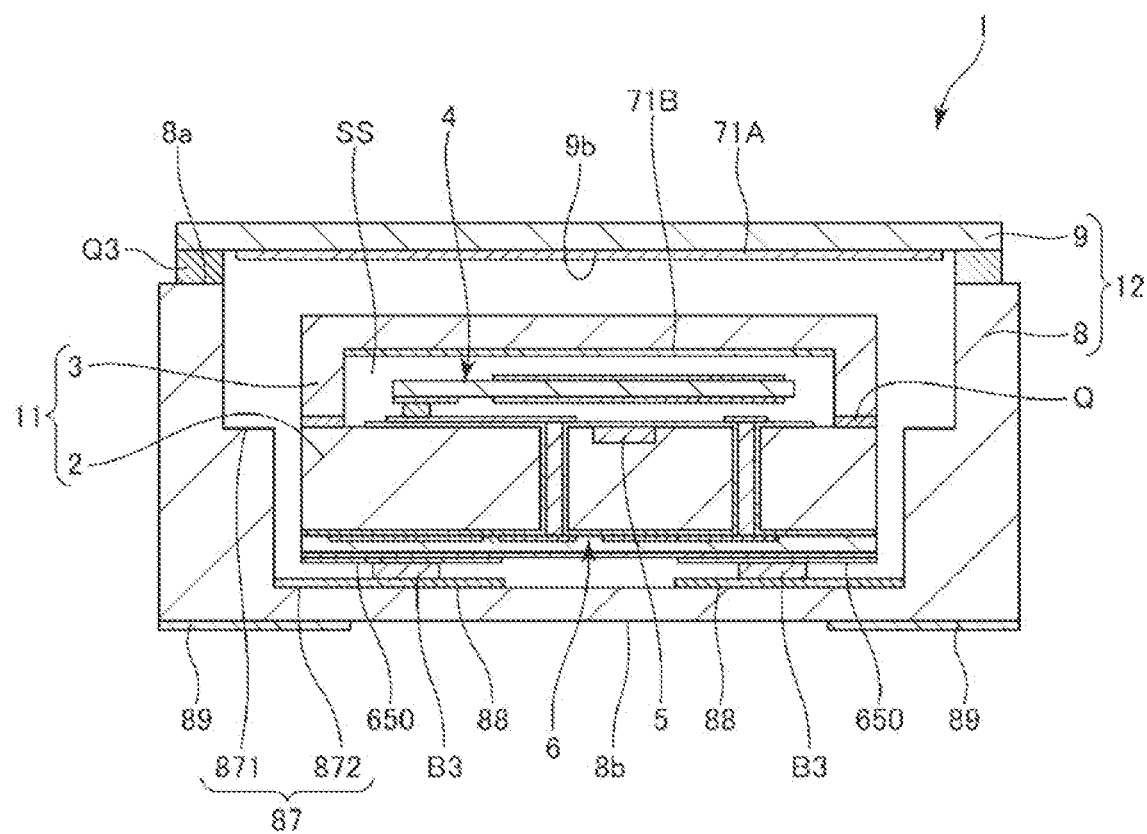
FIG. 12 is a cross-sectional view illustrating a resonator device according to a ninth embodiment.

FIG. 12 is a cross-sectional view illustrating a resonator device according to a ninth embodiment.

The present embodiment is the same as the eighth embodiment described above, except that a second low emissivity layer 71B is further provided. In the following description, the present embodiment will be described focusing on differences from the above-described embodiments, and the description of the same matters will be omitted. In addition, in the figure in the present embodiment, the same reference numerals are given to configurations similar to those according to the above-described embodiments.

As illustrated in FIG. 12, the resonator device 1 according to the present embodiment further includes the second low emissivity layer 71B that is disposed at the inner surface of the first lid 3 and that has an emissivity lower than an emissivity of the first lid 3. The second low emissivity layer 71B is the above-described low emissivity layer 71. Therefore, heat in the accommodation portion S is less likely to escape to the outside of the first package 11. Therefore, the inside of the accommodation portion S is uniformly heated, a temperature of the resonator element 4 is more stable, and the resonator device 1 can exert excellent oscillation characteristics. Further, since the heat in the accommodation portion S is less likely to escape, power consumption of the heater 5 is reduced, and the resonator device 1 can be driven in a power-saving manner.

Since an emissivity of silicon, which is a constituent material of the first lid 3, at room temperature is about 0.5, the emissivity of the second low emissivity layer 71B at room temperature may be less than 0.5. Accordingly, the heat in the accommodation portion S is less likely to escape, and the resonator device 1 can be driven in a power-saving manner and has the excellent oscillation characteristics.

A constituent material of the second low emissivity layer 71B is not particularly limited, and may contain at least one of copper, titanium, tungsten, aluminum, aluminum oxide, gold, chromium, nickel, nickel oxide, platinum, silver, and cobalt. The resonator device 1 can be easily manufactured using these materials.

As described above, the resonator device 1 according to the present embodiment includes the second low emissivity layer 71B that is disposed at the inner surface of the first lid 3 and that has the emissivity lower than the emissivity of the first lid 3. Accordingly, heat in the first package 11 is less likely to escape to the outside of the first package 11 through the first lid 3. Therefore, the inside of the first package 11 is uniformly heated, the temperature of the resonator element 4 is more stable, and the resonator device 1 can exert the excellent oscillation characteristics. Further, since the heat in the first package 11 is less likely to escape to the outside of the first package 11, the power consumption of the heater 5 is reduced, and the resonator device 1 can be driven in a power-saving manner.

As described above, the constituent material of the first lid 3 is silicon, and the emissivity of the second low emissivity layer 71B at room temperature is less than 0.5. Accordingly, the heat in the first package 11 is less likely to escape to the outside of the first package 11 through the first lid 3. Therefore, the resonator device 1 is energy-saving and can exert the excellent oscillation characteristics.

As described above, the constituent material of the second low emissivity layer 71B contains at least one of copper, titanium, tungsten, aluminum, aluminum oxide, gold, chromium, nickel, nickel oxide, platinum, silver, and cobalt. Accordingly, the resonator device 1 can be easily manufactured.

According to the ninth embodiment as described above, the same effect as that according to the above-described first embodiment can also be attained. However, the resonator device 1 according to the present embodiment is not limited to this. For example, the high emissivity layer 72 described in the sixth embodiment may be added to the first package 11 in the configuration in FIG. 12.

Tenth Embodiment

Figure 13:
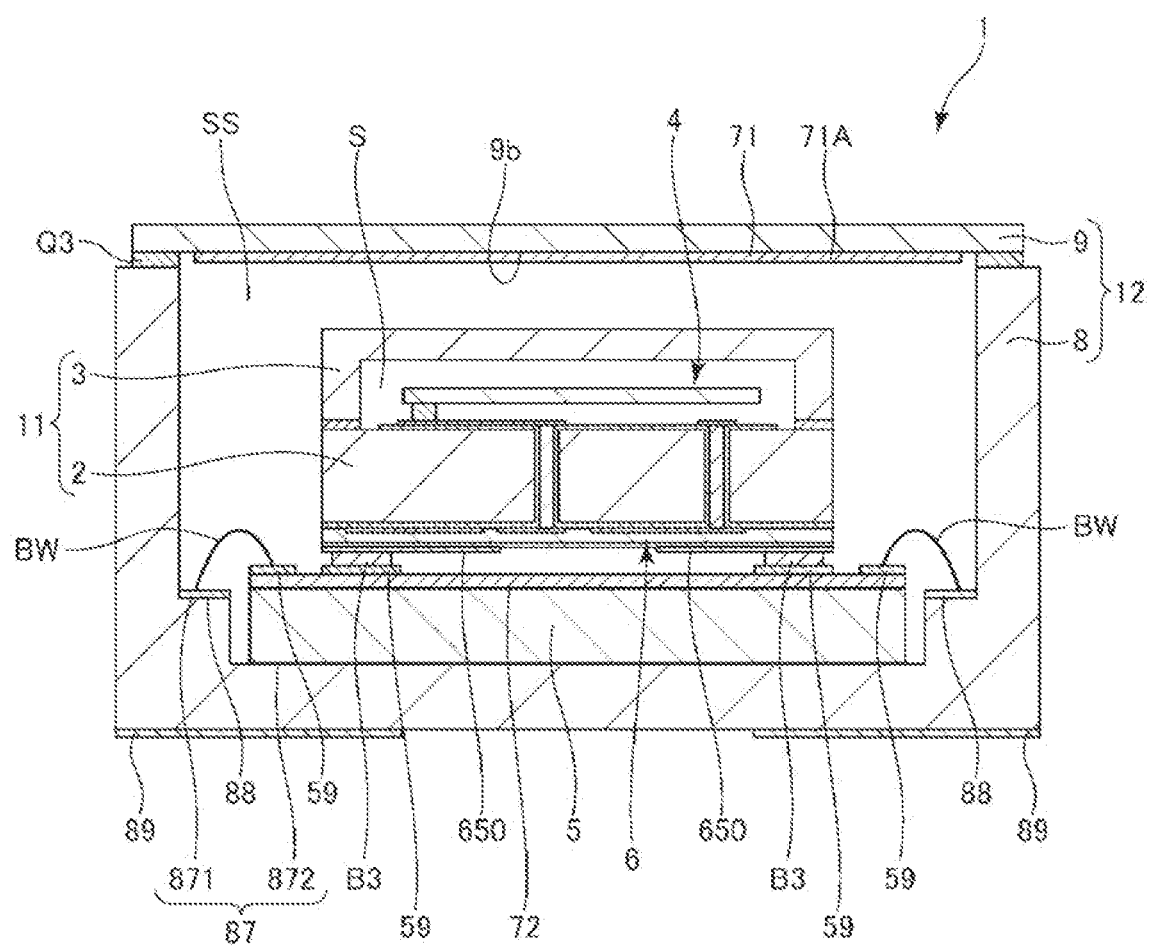
FIG. 13 is a cross-sectional view illustrating a resonator device according to a tenth embodiment.
Figure 14:
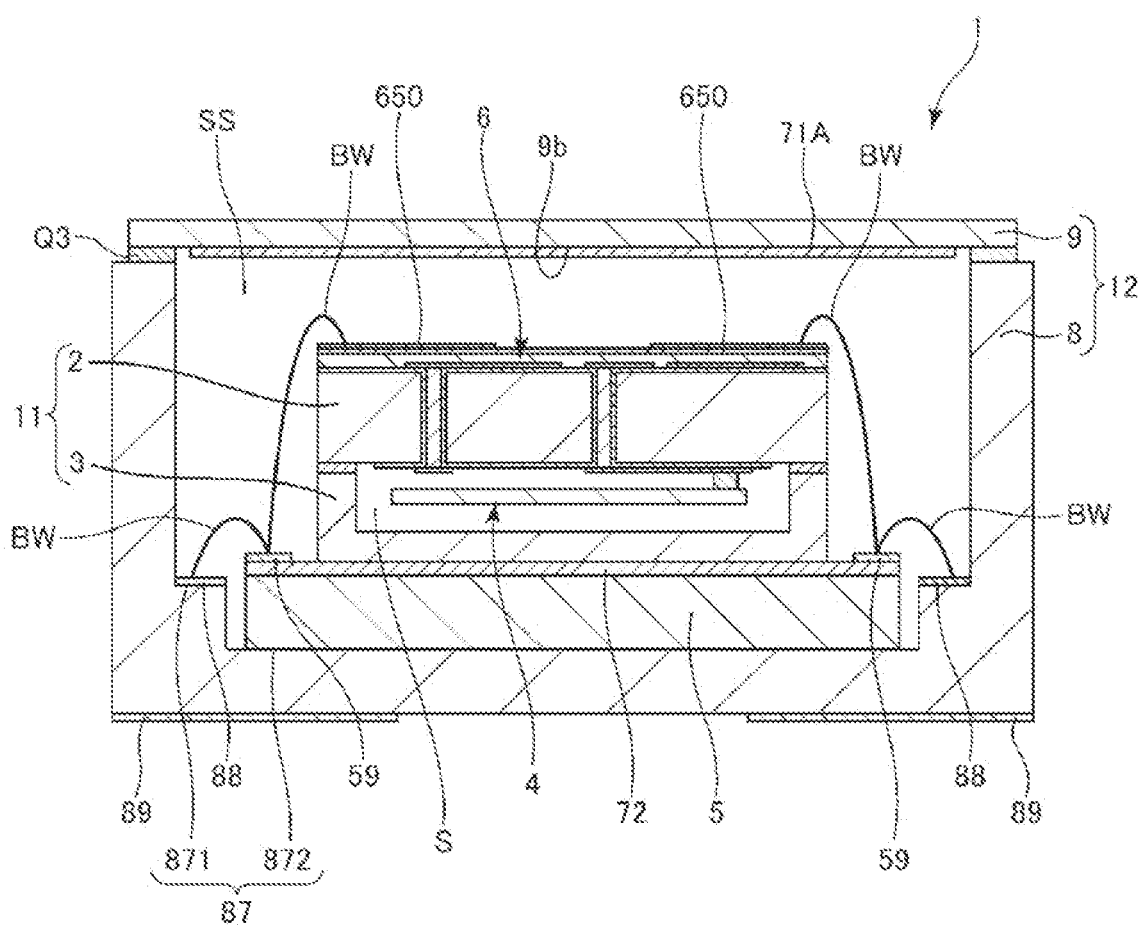
FIG. 14 is a cross-sectional view illustrating a modification of the resonator device in FIG. 13.
Figure 15:
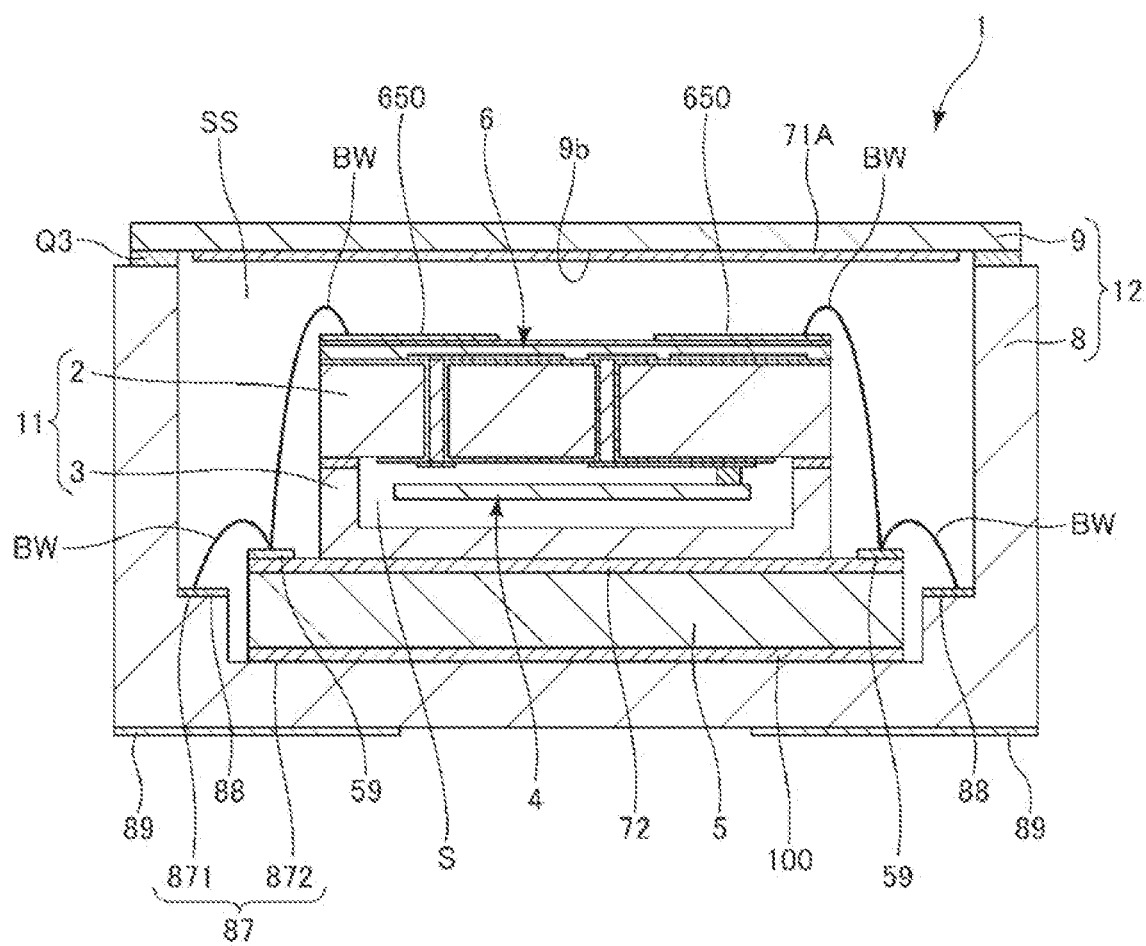
FIG. 15 is a cross-sectional view illustrating a modification of the resonator device in FIG. 13.
Figure 16:
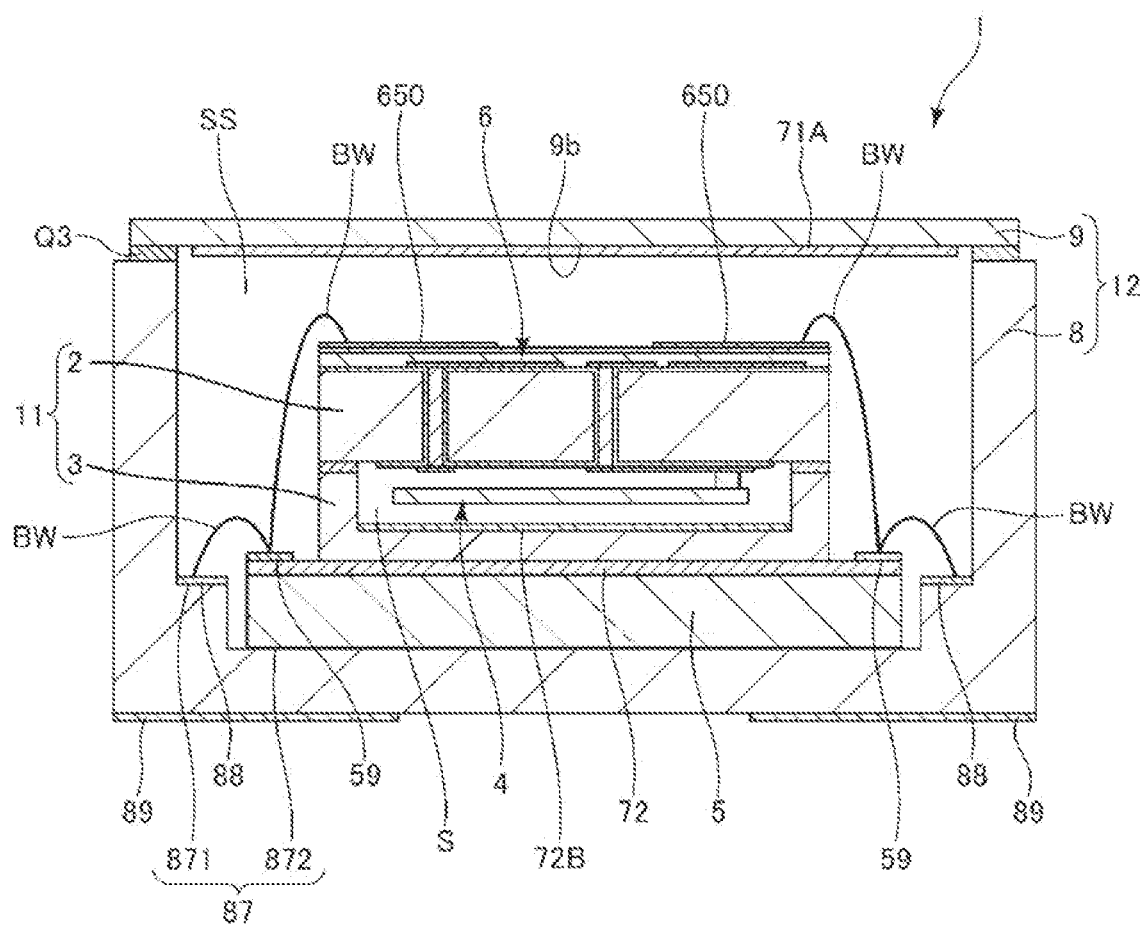
FIG. 16 is a cross-sectional view illustrating a modification of the resonator device in FIG. 13.

FIG. 13 is a cross-sectional view illustrating a resonator device according to a tenth embodiment. FIGS. 14 to 16 are cross-sectional views illustrating a modification of the resonator device in FIG. 13.

The present embodiment is the same as the above-described seventh embodiment, except that the disposition of the heater 5 is mainly different. In the following description, the present embodiment will be described focusing on differences from the above-described embodiments, and the description of the same matters will be omitted. In addition, in the figure in the present embodiment, the same reference numerals are given to configurations similar to those according to the above-described embodiments.

As illustrated in FIG. 13, in the resonator device 1 according to the present embodiment, the heater 5 is formed separately from the first base 2. Accordingly, for example, the heater 5 can be larger and the amount of heat generated by the heater 5 can be increased as compared with those according to the above-described seventh embodiment. Therefore, the resonator element 4 can be effectively heated. The heater 5 has a configuration in which for example, a silicon substrate is used as a base material, and the silicon substrate is doped with impurities such as phosphorus and boron to form a resistance, and the resistance generates heat by applying a voltage to the resistance. However, the configuration of the heater 5 is not particularly limited.

Such a heater 5 is disposed at the bottom surface of the second concave portion 872, and the first package 11 is disposed on the heater 5. In addition, the high emissivity layer 72 is disposed at the upper surface of the heater 5, and a plurality of terminals 59 are disposed at the upper surface of the high emissivity layer 72. A part of the terminals 59 are electrically coupled to the terminals 650 via the bonding members B3, and a part of the terminals 59 are electrically coupled to the terminals 88 via the bonding wires BW. Accordingly, the resonator element 4, the integrated circuit 6, the heater 5, and the terminal 89 are electrically coupled to one another.

The high emissivity layer 72 has an emissivity higher than that of silicon, which is the base material of the heater 5. Accordingly, the high emissivity layer 72 absorbs the heat of the heater 5 and efficiently releases the absorbed heat into the accommodation portion SS. Therefore, the resonator element 4 can be quickly heated to a desired temperature, and the resonator device 1 has good starting characteristics. In particular, according to the present embodiment, since a part of the heat absorbed by the high emissivity layer 72 is transferred to the first package 11 by thermal conduction via the bonding members B3, the inside of the first package 11 can be more efficiently heated. Therefore, the above-described effect is more remarkable.

As described above, since the emissivity of silicon at room temperature is about 0.5, the emissivity of the high emissivity layer 72 at room temperature may be 0.5 or more. Accordingly, the heat of the heater 5 can be more efficiently released into the accommodation portion S, and the resonator device 1 has better starting characteristics.

A constituent material of the high emissivity layer 72 may contain at least one of copper oxide, titanium oxide, silicon oxide, silicon nitride, a glass material, aluminum nitride, and platinum black. The resonator device 1 can be easily manufactured using these materials.

As described above, in the resonator device 1 according to the present embodiment, the heater 5 is disposed at the second base 8, and the first package 11 is disposed at the heater 5. Accordingly, for example, the heater 5 can be larger and the amount of heat generated by the heater 5 can be increased as compared with those according to the above-described seventh embodiment. Therefore, the resonator element 4 can be effectively heated.

According to the tenth embodiment, the same effect as that according to the above-described first embodiment can also be attained.

However, the resonator device 1 according to the present embodiment is not limited to this. For example, as illustrated in FIG. 14, an orientation of the first package 11 may be reversed and the first lid 3 may be disposed in a posture of facing the heater 5. In this case, the terminals 650 and the terminals 59 can be electrically coupled to each other using the bonding wires BW. In addition, as illustrated in FIG. 15, in the configuration in FIG. 14, the heat insulating layer 100 may be further interposed between the heater 5 and the bottom surface of the concave portion 87. Accordingly, it is possible to prevent the escape of the heat to the outside of the second package 12 due to thermal conduction. In addition, as illustrated in FIG. 16, a high emissivity layer 72B having an emissivity higher than that of the first lid 3 may be disposed at the inner surface of the first lid 3. Accordingly, the high emissivity layer 72B can absorb the heat of the heater 5 transmitted to the first lid 3 and efficiently release the absorbed heat into the accommodation portion S. Therefore, the resonator element 4 can be quickly heated to the desired temperature, and the resonator device 1 has good starting characteristics.

Eleventh Embodiment

Figure 17:
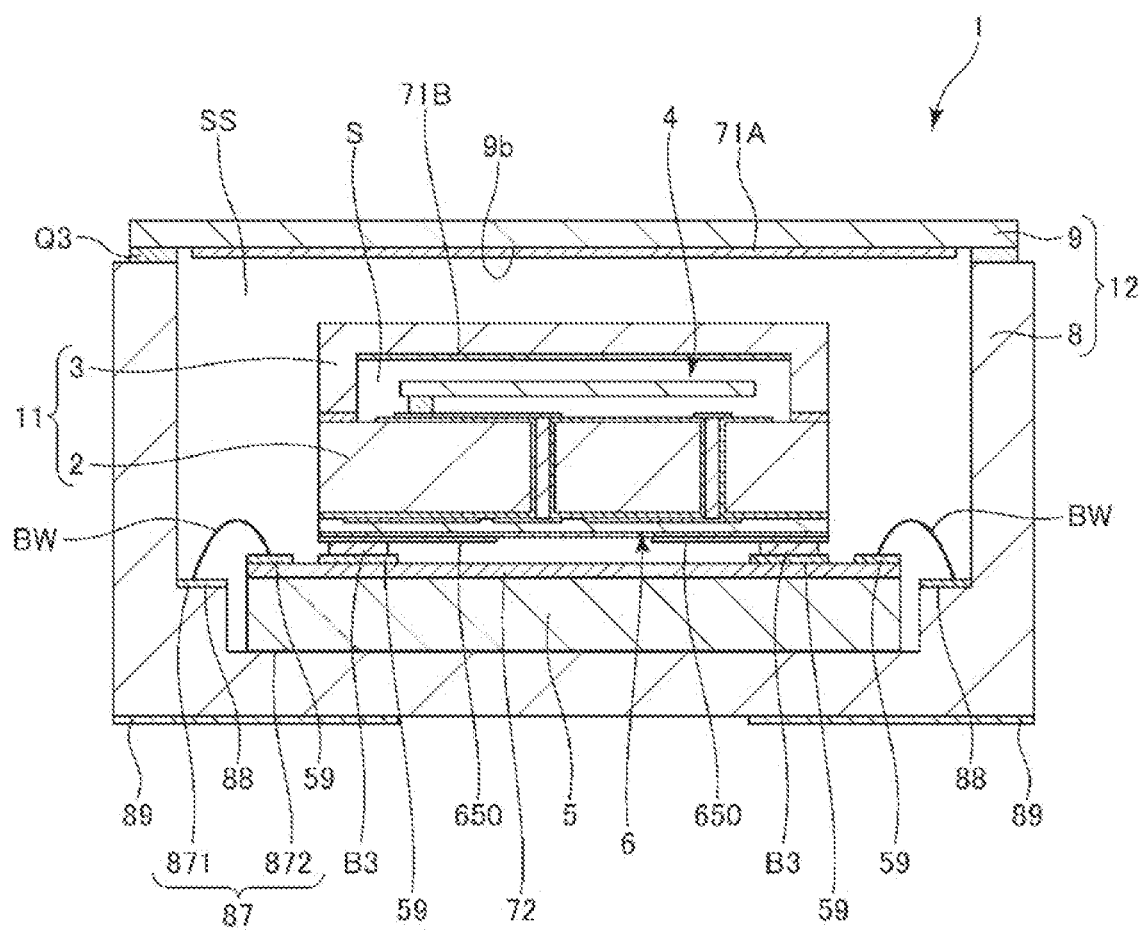
FIG. 17 is a cross-sectional view illustrating a resonator device according to an eleventh embodiment.

FIG. 17 is a cross-sectional view illustrating a resonator device according to an eleventh embodiment.

The present embodiment is the same as the tenth embodiment described above, except that the second low emissivity layer 71B is further provided. In the following description, the present embodiment will be described focusing on differences from the above-described embodiments, and the description of the same matters will be omitted. In addition, in the figure in the present embodiment, the same reference numerals are given to configurations similar to those according to the above-described embodiments.

As illustrated in FIG. 17, the resonator device 1 according to the present embodiment further includes the second low emissivity layer 71B that is disposed at the inner surface of the first lid 3 and that has an emissivity lower than an emissivity of the first lid 3. Therefore, heat in the accommodation portion S is less likely to escape to the outside of the first package 11. Therefore, the inside of the accommodation portion S is uniformly heated, a temperature of the resonator element 4 is more stable, and the resonator device 1 can exert excellent oscillation characteristics. Further, since the heat in the accommodation portion S is less likely to escape, power consumption of the heater 5 is reduced, and the resonator device 1 can be driven in a power-saving manner.

Since an emissivity of silicon, which is a constituent material of the first lid 3, at room temperature is about 0.5, the emissivity of the second low emissivity layer 71B at room temperature may be less than 0.5. Accordingly, the heat in the accommodation portion S is less likely to escape, and the resonator device 1 can be driven in a power-saving manner and has the excellent oscillation characteristics.

A constituent material of the second low emissivity layer 71B is not particularly limited, and may contain at least one of copper, titanium, tungsten, aluminum, aluminum oxide, gold, chromium, nickel, nickel oxide, platinum, silver, and cobalt. The resonator device 1 can be easily manufactured using these materials.

According to the eleventh embodiment as described above, the same effect as that according to the above-described first embodiment can also be attained.

Twelfth Embodiment

Figure 18:
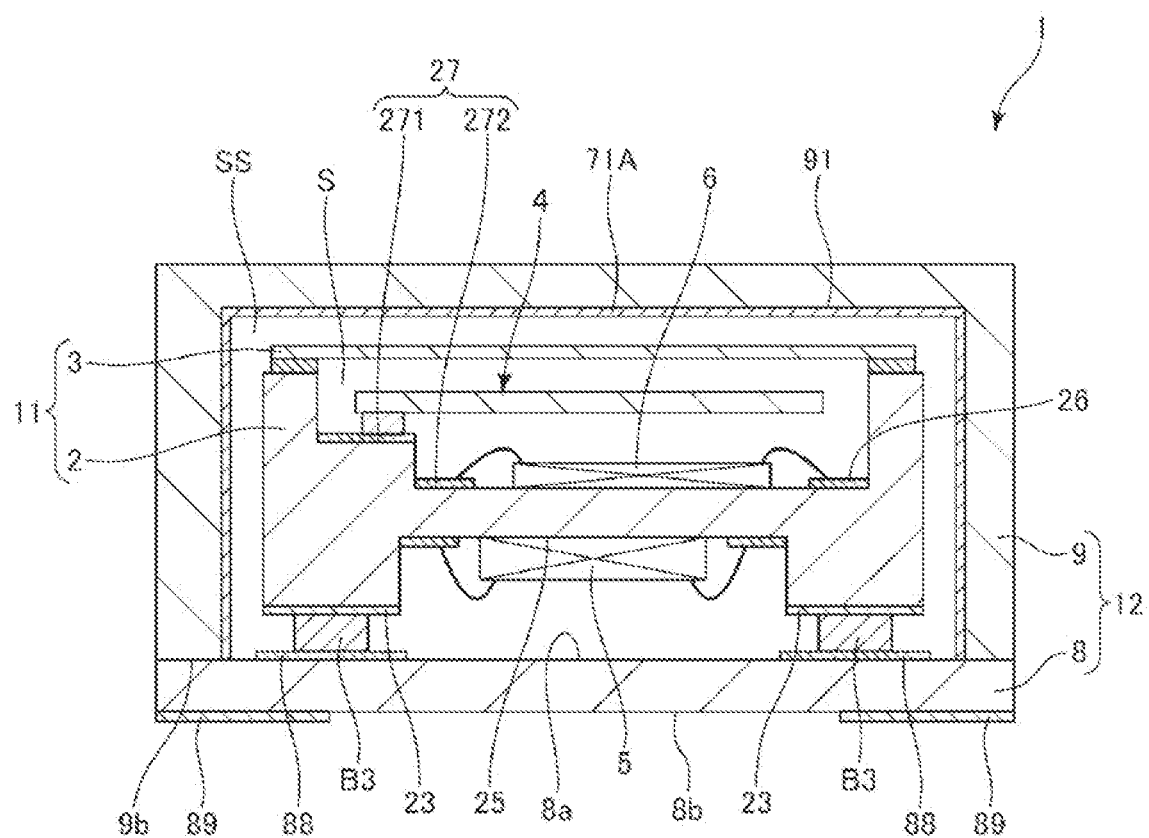
FIG. 18 is a cross-sectional view illustrating a resonator device according to a twelfth embodiment.

FIG. 18 is a cross-sectional view illustrating a resonator device according to a twelfth embodiment.

The present embodiment is the same as the above-described fifth embodiment, except that the second package 12 accommodating the first package 11 is provided, and that the disposition of the low emissivity layer 71 is different. In the following description, the present embodiment will be described focusing on differences from the above-described embodiments, and the description of the same matters will be omitted. In addition, in the figure in the present embodiment, the same reference numerals are given to configurations similar to those according to the above-described embodiments.

As illustrated in FIG. 18, the second package 12 includes the second base 8 to which the first package 11 is bonded, and the second lid 9 that covers the first package 11 and that is bonded to the upper surface 8a of the second base 8. The second base 8 and the second lid 9 are formed of a substrate made of an insulating material having a low thermal conductivity, such as a glass epoxy resin substrate, a paper phenol substrate, a paper epoxy substrate, and a glass composite substrate. Accordingly, the resonator device 1 is not likely to be affected by an ambient temperature.

The plurality of terminals 88 are disposed at the upper surface 8a of the second base 8, and the plurality of terminals 89 electrically coupled to the terminals 88 are disposed at the lower surface 8b of the second base 8. Further, the first package 11 is disposed at the upper surface 8a of the second base 8. The first package 11 is fixed to the second base 8 via the conductive bonding members B3 in a posture in which the first base 2 faces the second base 8. In addition, the terminals 23 and the terminals 88 are electrically coupled to each other via the bonding members B3. In addition, the second lid 9 has a bottomed accommodating concave portion 91 that is open to the lower surface 9b and that accommodates the first package 11 inside.

The low emissivity layer 71 is omitted from the inner surface of the first lid 3, and instead, the first low emissivity layer 71A having an emissivity lower than that of the second lid 9 is disposed at the inner surface of the second lid 9, that is, a bottom surface of the accommodating concave portion 91 according to the present embodiment. Therefore, heat in the heater 5 is less likely to escape to the outside of the second package 12. Therefore, the inside of the accommodation portion S is uniformly heated, a temperature of the resonator element 4 is more stable, and the resonator device 1 can exert excellent oscillation characteristics. Further, since heat in the accommodation portion S is less likely to escape, power consumption of the heater 5 is reduced, and the resonator device 1 can be driven in a power-saving manner.

According to the twelfth embodiment as described above, the same effect as that according to the above-described first embodiment can also be attained.

As described above, although the resonator device according to the present disclosure is described based on the illustrated embodiments, the present disclosure is not limited to this. A configuration of each part can be replaced with any configuration having a similar function. In addition, any other constituents may be added to the present disclosure. Further, the embodiments may be combined as appropriate.

According to the above embodiments, the resonator device 1 is the oven controlled crystal oscillator (OCXO) including the heater 5 serving as the heat generating unit, but the present disclosure is not limited to this. That is, the resonator device 1 may not be the oven controlled crystal oscillator (OCXO). In this case, the heat generating unit may be, for example, a buffer circuit and a power supply circuit that are provided in the integrated circuit 6.

What is claimed is:

1. A resonator device comprising:
   a resonator element;
   a heat generating unit;
   a first package including a first base at which the resonator element and the heat generating unit are disposed, and a first lid bonded to the first base so as to accommodate the resonator element between the first lid and the first base; and
   a low emissivity layer that is disposed at an inner surface of the first lid and that has an emissivity lower than an emissivity of the first lid.

2. The resonator device according to claim 1, wherein
   a constituent material of the first lid is silicon, and
   the emissivity of the low emissivity layer at room temperature is less than 0.5.

3. The resonator device according to claim 2, wherein
   a constituent material of the low emissivity layer contains at least one of copper, titanium, tungsten, aluminum, aluminum oxide, gold, chromium, nickel, nickel oxide, platinum, silver, and cobalt.

4. The resonator device according to claim 1, wherein
   a constituent material of the first lid is Kovar, and
   the emissivity of the low emissivity layer at room temperature is less than 0.05.

5. The resonator device according to claim 4, wherein
   a constituent material of the low emissivity layer contains at least one of copper, tungsten, aluminum, and gold.

6. The resonator device according to claim 1, further comprising:
   a bonding layer configured to bond the first lid and the first base, wherein
   the low emissivity layer is made of same material as the bonding layer.

7. The resonator device according to claim 1, wherein
   the low emissivity layer is also disposed at an outer surface of the first lid.

8. The resonator device according to claim 1, further comprising
   a second package including a second base at which the first package is disposed and a second lid bonded to the second base so as to accommodate the first package between the second lid and the second base.

9. A resonator device comprising:
   a resonator element;
   a heat generating unit;
   a first package including a first base at which the resonator element is disposed, and a first lid bonded to the first base so as to accommodate the resonator element between the first lid and the first base;
   a second package including a second base at which the first package is disposed, and a second lid bonded to the second base so as to accommodate the first package and the heat generating unit between the second lid and the second base; and a first low emissivity layer that is disposed at an inner surface of the second lid and that has an emissivity lower than an emissivity of the second lid.

10. The resonator device according to claim 9, wherein a constituent material of the second lid is Kovar, and the emissivity of the first low emissivity layer at room temperature is less than 0.05.

11. The resonator device according to claim 10, wherein a constituent material of the first low emissivity layer contains at least one of copper, tungsten, aluminum, and gold.

12. The resonator device according to claim 9, further comprising a second low emissivity layer that is disposed at an inner surface of the first lid and that has an emissivity lower than an emissivity of the first lid.

13. The resonator device according to claim 12, wherein a constituent material of the first lid is silicon, and the emissivity of the second low emissivity layer at room temperature is less than 0.5.

14. The resonator device according to claim 13, wherein a constituent material of the second low emissivity layer contains at least one of copper, titanium, tungsten, aluminum, aluminum oxide, gold, chromium, nickel, nickel oxide, platinum, silver, and cobalt.

15. The resonator device according to claim 9, wherein the heat generating unit is disposed at the first base.

16. The resonator device according to claim 9, wherein the heat generating unit is disposed at the second base, and the first package is disposed at the heat generating unit.

* * * * *